(12) United States Patent
Seo et al.

(10) Patent No.: US 9,978,430 B2
(45) Date of Patent: May 22, 2018

(54) MEMORY DEVICES PROVIDING A REFRESH REQUEST AND MEMORY CONTROLLERS RESPONSIVE TO A REFRESH REQUEST

(71) Applicants: Eun-Sung Seo, Seoul (KR); Chul-Woo Park, Yongin-si (KR); Hong-Sun Hwang, Suwon-si (KR)

(72) Inventors: Eun-Sung Seo, Seoul (KR); Chul-Woo Park, Yongin-si (KR); Hong-Sun Hwang, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 153 days.

(21) Appl. No.: 13/733,884

(22) Filed: Jan. 3, 2013

(65) Prior Publication Data
US 2013/0279283 A1 Oct. 24, 2013

(30) Foreign Application Priority Data
Apr. 24, 2012 (KR) .......................... 10-2012-0042413

(51) Int. Cl.
*G11C 7/00* (2006.01)
*G11C 11/406* (2006.01)

(52) U.S. Cl.
CPC .......... *G11C 7/00* (2013.01); *G11C 11/40611* (2013.01)

(58) Field of Classification Search
CPC ............. G11C 11/40611; G11C 11/401; G11C 11/406
USPC .. 365/52, 222, 230.03, 236, 189.011, 189.2; 713/185

See application file for complete search history.

(56) References Cited

U.S. PATENT DOCUMENTS

| 6,463,001 | B1 * | 10/2002 | Williams ....................... 365/222 |
| 6,898,711 | B1 * | 5/2005 | Bauman et al. .............. 713/185 |
| 6,954,387 | B2 * | 10/2005 | Kim et al. ..................... 365/222 |
| 7,236,416 | B2 | 6/2007 | Walker |
| 7,543,106 | B2 * | 6/2009 | Choi ............................. 365/222 |
| 7,734,866 | B2 * | 6/2010 | Tsern .................... G11C 11/406 365/185.25 |
| 7,885,134 | B2 * | 2/2011 | Li et al. ........................ 365/222 |
| 7,975,170 | B2 * | 7/2011 | Hummler et al. ............ 365/222 |

(Continued)

FOREIGN PATENT DOCUMENTS

| CN | 1973333 A | 5/2007 |
| CN | 102326205 A | 1/2012 |

(Continued)

OTHER PUBLICATIONS

Office Action dated Oct. 24, 2017 for corresponding application No. CN 201310146077.5.

*Primary Examiner* — Alexander Sofocleous
*Assistant Examiner* — Alfredo Bermudez Lozada
(74) *Attorney, Agent, or Firm* — Muir Patent Law, PLLC

(57) ABSTRACT

A memory system includes at least one memory device and a memory controller. The at least one memory device includes a refresh request circuit that generates refresh request signals at timings based on data retention times of memory cells, such as based on individual data retention times of a memory cell row. The memory controller schedules operation commands for the at least one memory device in response to the received refresh request signals.

26 Claims, 23 Drawing Sheets

(56) References Cited

U.S. PATENT DOCUMENTS

| | | |
|---|---|---|
| 8,400,859 B2 | 3/2013 | Pelley, III et al. |
| 8,595,449 B2 * | 11/2013 | Kund et al. .................... 365/222 |
| 8,626,998 B1 * | 1/2014 | Amidi et al. ................. 365/222 |
| 2005/0041500 A1 * | 2/2005 | Lee ....................... G11C 11/406 |
| | | 365/222 |
| 2005/0259493 A1 * | 11/2005 | Walker .............. G11C 11/40618 |
| | | 365/222 |
| 2007/0106838 A1 | 5/2007 | Choi |
| 2009/0016135 A1 | 1/2009 | Tomita |
| 2009/0204752 A1 | 8/2009 | Sasaki |
| 2011/0125982 A1 | 5/2011 | Choi et al. |
| 2011/0131385 A1 | 6/2011 | Henriksson et al. |
| 2011/0141795 A1 | 6/2011 | Matsuzaki et al. |

FOREIGN PATENT DOCUMENTS

| | | |
|---|---|---|
| JP | 2009-021707 | 1/2009 |
| KR | 10-2004-0056124 A | 6/2004 |
| KR | 10-2007-0048337 A | 5/2007 |
| WO | WO 2008/047443 A1 | 4/2008 |

* cited by examiner

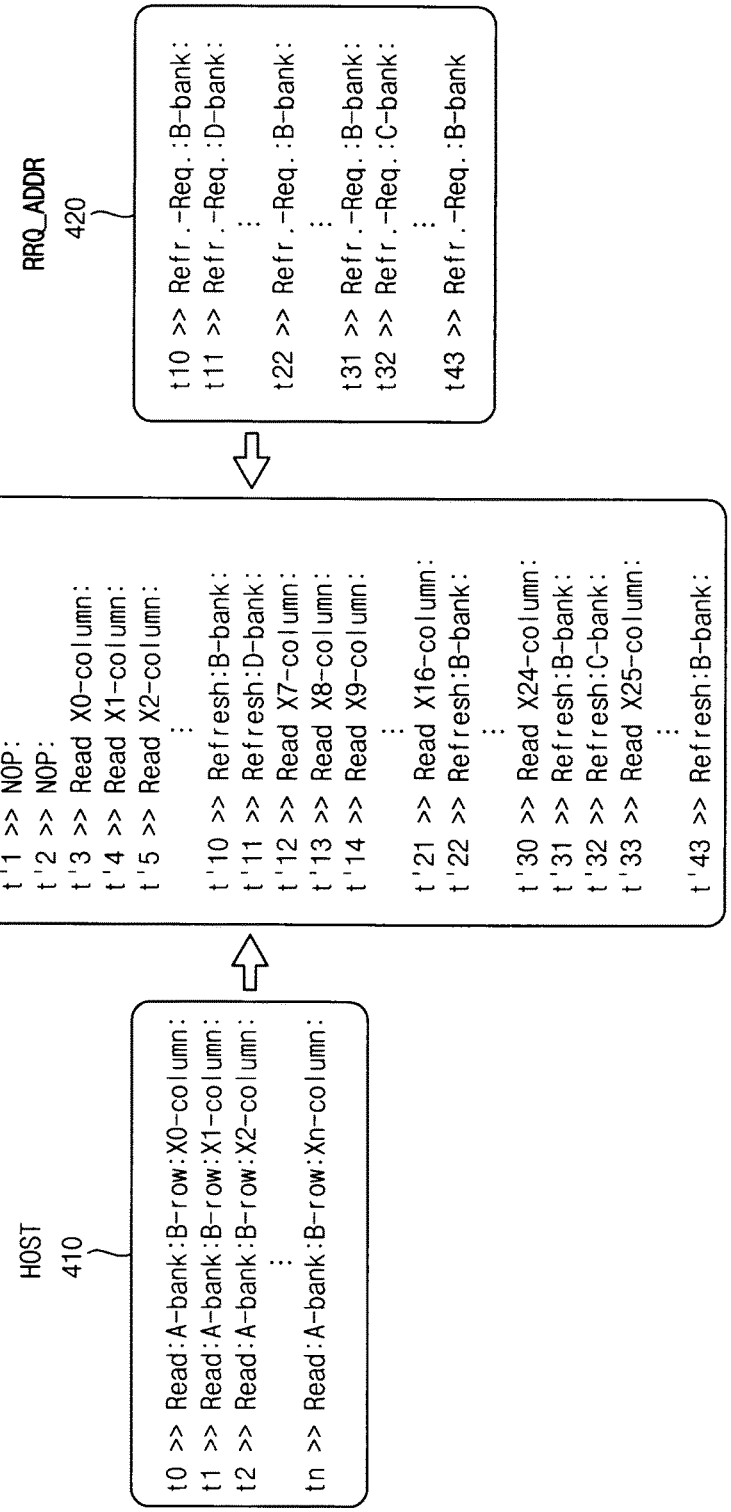

MEMORY DEVICES PROVIDING A REFRESH REQUEST AND MEMORY CONTROLLERS RESPONSIVE TO A REFRESH REQUEST

CROSS-REFERENCE TO RELATED APPLICATION(S)

This application claims priority under 35 USC § 119 to Korean Patent Application No. 10-2012-0042413, filed on Apr. 24, 2012, in the Korean Intellectual Property Office (KIPO), the contents of which are incorporated herein in its entirety by reference.

BACKGROUND

1. Technical Field

Exemplary embodiments relate to memory devices, and more particularly to a memory system, a memory device, a memory controller and methods of operating the same.

2. Discussion of the Related Art

A volatile memory device, such as a dynamic random access memory (DRAM), may perform a refresh operation to retain data stored in memory cells. If a memory cell has a retention time shorter than a refresh period defined in the standard, a row of memory cells including the memory cell should be replaced with a row of redundancy cells. As the size of a memory cell shrinks, the number of memory cells having retention times shorter than the refresh period increases. Accordingly, the number of rows of redundancy cells should be increased in a conventional volatile memory device.

SUMMARY

Some example embodiments provide a memory system capable of enhancing performance.

Some example embodiments provide a memory device capable of enhancing performance.

Some example embodiments provide a memory controller capable of enhancing performance.

Some example embodiments provide a method of operating the memory system, memory device and/or memory controller.

According to some embodiments, a method of operating a memory device, may comprise sending a request for a refresh command to a memory controller to cause the memory controller to generate a first refresh command; receiving the first refresh command from the memory controller; and refreshing memory of the memory device in response to receiving the first refresh command.

The sending may comprise sending a request for a refresh command with a first memory address to the memory controller, and the refreshing may comprise, in response to the receiving the first refresh command, refreshing memory associated with the first memory address.

The receiving may comprise receiving the first refresh command with the first memory address.

Methods may further comprise generating plural first requests for a refresh command for a first group of memory cells to the memory controller at a first rate; and generating plural second requests for a refresh command for a second group of memory cells to the memory controller at a second rate, the second rate being different than the first rate.

Each of groups of memory cells may have a data retention time reflecting an ability store data for a time period prior to needing to be refreshed, The group of first memory cells may a first data retention time, the group of second memory cells may have a second data retention time, where the first data retention time is different than the second data retention time.

Methods may further comprise accessing a look-up table storing a refresh schedule of memory addresses; and issuing a series of refresh requests to the memory controller at a timing responsive to the refresh schedule.

Methods may further comprise accessing a register set storing a refresh rate of a memory device; and issuing a series of refresh requests to the memory controller according to the refresh rate.

Methods may further comprise accessing a temperature sensor unit indicating a temperature of a memory device; and issuing a series of refresh requests to the memory controller at a rate responsive to temperature.

Each refresh request may be associated with a single memory address identifying memory cells that are configured to be refreshed simultaneously.

Each refresh request may be associated with a plurality of memory addresses, each memory address of the plurality of memory addresses identifying memory cells that are configured to be refreshed simultaneously.

Accessing the look-up table may comprise receiving a series of the memory addresses of the refresh schedule, and the issuing a series of refresh requests may comprise issuing each refresh request of the series of refresh requests with a corresponding memory address of the refresh schedule.

Accessing may comprise reading a sequence of entries of the look-up table at regular intervals, each reading resulting in one of a memory address of the memory addresses or first information indicating no refresh request is necessary for an interval.

The sequence of entries of the look-up table may include multiple entries of a first memory address of the memory addresses.

The memory device may be a dynamic random access memory (DRAM) comprising a plurality of banks, each bank comprising a plurality of rows of memory, and the refresh schedule of the look-up table contains an entry for each of the plurality of rows of memory for at least one of the banks.

The refresh schedule of the look-up table may contain multiple entries for at least a first row of memory of the plurality of rows of memory.

The refresh schedule of the look-up table may contain an entry for each of the plurality of rows for all of the banks.

Accessing may comprise reading a sequence of entries of the look-up table at irregular intervals, and the timing of a next reading operation of a next entry of the look-up table may be determined from wait information stored in the look-up table.

The sequence of entries of the look-up table may include multiple entries of a first memory address of the memory addresses.

Each entry of the look-up table may include a memory address and wait information to determine a timing of a next reading operation of the entries of the look up table.

The wait information may be a number of clock cycles.

Methods may also comprise accessing a look-up table storing a refresh schedule of memory addresses; generating a sequence of memory addresses by incrementing an address counter; and a series of refresh requests to the memory controller in response to the accessing of the look-up table and the generating the sequence of memory addresses.

Generating may comprise generating a sequence of memory addresses by incrementing an address counter at a first rate, and issuing the series of refresh requests may comprise issuing refresh requests corresponding to the sequence of memory addresses generated by the address counter at the first rate and additionally issuing refresh requests corresponding to memory addresses of the refresh schedule.

Methods may also include a memory controller receiving the request for the refresh command from the memory device; and in response to the receiving, sending the first refresh command to the memory device.

Methods may also include a memory controller scheduling the sending of the first refresh command in response to a timing of receiving the request for the refresh command.

The scheduling the sending of the first refresh command may also be in response to an access request from a host.

The sending of the request for a refresh command may comprise sending the request for the refresh command via at least one data mask line.

The sending of the request for a refresh command may comprise sending the request for the refresh command via at least one data line.

Methods may comprise performing a refresh operation for a plurality of first rows of memory cells of the semiconductor chip memory at a first refresh rate; and performing a refresh operation for a plurality of second rows of memory cells of the semiconductor chip memory at one or more second refresh rates, each of the one or more second refresh rates being higher than the first refresh rate.

At least one of the second rows of memory cells may be interspersed between the first rows of memory cells.

The one or more second refresh rates may be a function of accessing a look up table storing addresses of the second rows of memory cells.

A memory device may include a plurality of rows of memory cells; a refresh request circuit configured to issue requests for refresh operations to an external device; and control logic configured to receive commands from the external device and control the memory device in accordance with the received commands, wherein the refresh request circuit is configured to issue a request for a refresh operation for a first row of memory cells to the external device, and control logic is configured to receive a first refresh command to refresh the first row from the external device and cause a refresh operation of the first row of memory cells in response to the first request command.

The refresh request circuit may be configured to issue requests for refresh operations for a plurality of first rows of memory cells of the memory device at a first refresh rate and issue requests for refresh operations for a plurality of second rows of memory cells of the memory device at one or more second refresh rates, each of the one or more second refresh rates being higher than the first refresh rate.

The refresh request circuit may comprise a lookup table configured to store addresses of the plurality of second rows of memory cells at table entries of the lookup table, and a sequential access of the entries of the lookup table may determine a timing of issuance of requests for refresh operations for the second rows of memory cells.

The lookup table may be configured to store addresses of the plurality of first rows of memory cells at table entries of the lookup table, and sequential access of the entries of the lookup table may determine a timing of issuance of requests for refresh operations for the first rows of memory cells.

The refresh request circuit may comprise an address counter configured to generate sequential addresses of the memory of the memory cells, including addresses of the first and second rows of memory cells, the refresh request circuit may be configured to issue requests for refresh operations for rows of memory cells identified by the sequential addresses generated by the address counter.

The memory device may comprise a multiplexer, the multiplexer configured to select sequential addresses generated by the address counter and addresses of the plurality of second rows output by the lookup table and provide the selected address for output to the external device.

The memory device may comprise a lookup table pointer generator configured to output and regularly change a table pointing signal used to access a table entry of the lookup table corresponding to the table pointing signal.

The lookup table may include empty table entries between table entries containing addresses of second rows of memory cells acting to regulate a timing between a sequential output of the addresses of the second rows of memory cells.

The entries of the lookup table may include wait information, and a timing of a change of the lookup table pointer may be responsive to the wait information.

Entries of the lookup table may include wait information, and a timing of a change of the lookup table pointer from identifying a first entry of the lookup table to identifying a second entry of the lookup table may be responsive to wait information stored with the first entry of the lookup table.

Memory controller may comprise command generator, configured to generate memory commands in response to command requests from a host; a scheduler, configured to generate a command queue providing a sequential list of memory commands to be issued to a memory device; and a storage unit configured to store one or more addresses of the memory device received with a refresh request from a refresh request circuit, wherein the scheduler may be configured to alter a first sequential list of memory commands in the command queue to insert refresh commands into the command queue corresponding to the one or more addresses of the memory device stored in the storage unit.

The storage unit may be configured to store non-sequential addresses of the memory device to provide different refresh rates for different memory locations of the memory device.

The scheduler may be configured to provide refresh commands for first rows of memory cells at a first rate and provide refresh commands for second rows of memory cells at one or more second rates, the second rates being higher than the first rate.

The memory controllers may include a buffer configured to receive the one or more addresses of the memory device from a refresh request circuit external to the memory controller.

The memory controllers may include a data mask pin configured to receive the refresh request from the refresh request circuit external to the memory controller.

The memory controller may include the refresh request circuit.

Memo systems may comprise a memory controller in communication with a memory device. The memory controller may be one of those described herein. The memory device may be one of those described herein.

In some example embodiments, a memory system includes at least one memory device and a memory controller. The at least one memory device includes a refresh request circuit that generates refresh information signal including a refresh request signal based on data retention time of each of a plurality of memory cells. The memory controller schedules operation command for the at least one memory device by considering the refresh request signal to control the at least one memory device.

In an embodiment, the refresh information signal may further include at least one refresh request address indicating at least one memory cell row to be refreshed of the plurality of memory cells.

The refresh information signal may be transmitted to the memory controller in a packet type.

The at least one refresh request address may be transmitted to the memory controller through a data transmission line between the memory controller and the at least one memory device.

The at least one refresh request address may include a plurality of memory cell row addresses and the memory controller schedules the operation command by considering refresh operation of the plurality of memory cell row addresses.

In an embodiment, the refresh request circuit may include a look-up table that stores refresh request addresses according to order of memory cell rows to be refreshed based on the data retention time of the memory cells; a look-up table pointer that generates a table pointing signal indicating the refresh request addresses by gradually increasing table addresses of the look-up table in synchronization with a clock signal; and a refresh request signal generator that detects output of the refresh request addresses from the look-up table to output the refresh request signal.

In an embodiment, the refresh request circuit may include a look-up table that stores refresh request addresses according to order of memory cell rows to be refreshed based on the data retention time of the memory cells and further stores wait clock information indicating output timing of the refresh request addresses; a look-up table pointer that generates a table pointing signal indicating the refresh request addresses by gradually increasing table addresses of the look-up table and delays providing the table pointing signal to the look-up table by wait clocks indicated by the wait clock information based on a clock signal and the wait clock information; and a refresh request signal generator that detects output of the refresh request addresses from the look-up table to output the refresh request signal.

In an embodiment, the refresh request circuit may include an address counter that sequentially generates row addresses designating memory cell rows of the memory cells in synchronization with a clock signal; a look-up table that stores weak cell row addresses of the memory cell rows, each of the weak cell row addresses designating a memory cell row including at least one weak cell whose data retention time is shorter than normal cells; a look-up table pointer that generates a table pointing signal indicating the refresh request addresses by gradually increasing table addresses of the look-up table; and a multiplexer that preferentially selects the weak cell row addresses of the row addresses and the weak cell row addresses.

In an embodiment, the at least one memory device may include a plurality of banks, the refresh information signal further include a refresh timing information for the plurality of banks, and the memory controller may control the at least one memory device such that refresh operation is performed per bank.

In an embodiment, the memory controller may include a storing unit that stores at least one refresh request address of the refresh information signal; a command generator that generates command for controlling the at least one memory device; a scheduler that schedules the at least one refresh request address and the command to provide the operation command; and a control unit that controls the scheduler based on the refresh request signal of the refresh information signal.

In some example embodiments, a memory system includes a memory module including a plurality of memory devices and a memory controller configured to control the plurality of memory devices. Each of the plurality of memory devices transmits a refresh request signal to the memory controller when memory cells in corresponding memory device needing to be refreshed. The memory controller transmits a response signal to the corresponding memory device in response to the refresh request signal. The corresponding memory device transmits to the memory controller a refresh information signal including at least one row address to be refreshed of the corresponding memory device in response to the response signal.

In an embodiment, the refresh request signal may be transmitted to the memory controller through a transmission line between the plurality of memory devices and the memory controller.

The transmission line may transmit data mask signal from the memory controller to the plurality of memory devices in write operation of the plurality of memory devices.

The memory module may further include a signal merging circuit that merges refresh request signals from the plurality of memory devices to be provided to the memory controller.

In an embodiment, the refresh information signal may be transmitted to the memory controller through a data transmission line between the plurality of memory devices and the memory controller.

In an embodiment, each of the plurality of memory devices may include a refresh request circuit that transmits the refresh request signal and the refresh information signal to the memory controller. The refresh request circuit may include a look-up table that stores refresh request addresses according to order of memory cell rows to be refreshed based on the data retention time of the memory cells; a refresh request signal generator that monitors the look-up table to output the refresh request signal; a clock generator that generates a clock signal in response to a response signal; a look-up table pointer that generates a table pointing signal indicating the refresh request addresses by gradually increasing table addresses of the look-up table in synchronization with the clock signal; and an information tagger that adds identification information to the refresh request address from the look-up table to output the refresh information signal.

In some example embodiments, a method of operating a memory system including a memory module having a plurality of memory devices and a memory controller that controls the plurality of memory devices, includes transmitting, in at least one of the plurality of memory devices, a refresh request signal to the memory controller; transmitting, in the memory controller, a response signal to the at least one memory device in response to the refresh request signal; transmitting, in the at least one memory device, a refresh information signal to the memory controller in response to the response signal; transmitting, in the memory controller, a refresh command to the at least one memory device in response to the refresh information signal; and performing, in the in the at least one memory device, refresh operation in response to the refresh command.

In some example embodiments, a memory device includes a memory cell array including a plurality of memory cells and a refresh request circuit. The refresh request circuit externally transmit refresh information signal including a refresh request signal based on data retention time of each of a plurality of memory cells.

In an embodiment, the refresh information signal may further include refresh request addresses according to order of memory cell rows to be refreshed based on the data retention time of the memory cells. The refresh request signal may be externally transmitted through a data mask pin. The refresh request addresses may be externally transmitted through data pins.

In some example embodiments, a memory controller includes a storing unit, command generator and a scheduler. The storing unit stores at least one refresh request address of refresh information signal from a memory device. The command generator generates command for controlling the memory device. The scheduler schedules the at least one refresh request address and the command to provide operation command for controlling the memory device.

Accordingly, the memory device requests refresh operation according to data retention time of memory cells or pages and the memory controller schedules operation command of the memory device by considering the requested refresh operation. Therefore, performance of the memory system may be enhanced and power consumption may be reduced.

BRIEF DESCRIPTION OF THE DRAWINGS

Illustrative, non-limiting exemplary embodiments will be more clearly understood from the following detailed description taken in conjunction with the accompanying drawings.

FIGS. 10A, 10B and 10C illustrate exemplary operations of the scheduler in FIG. 3 according to some example embodiments.

DETAILED DESCRIPTION OF THE EMBODIMENTS

Figure 1:
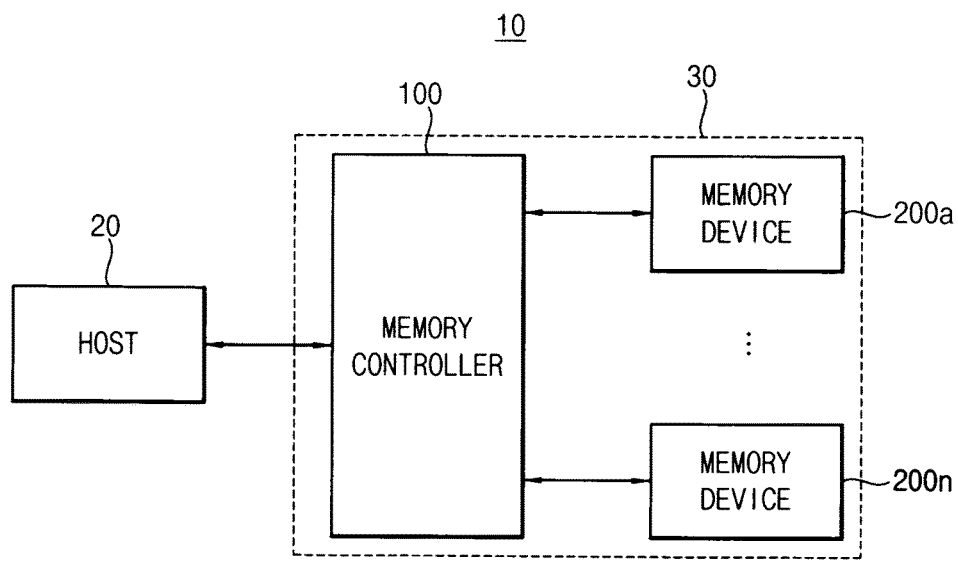
FIG. 1 is a block diagram illustrating an electronic system according to some example embodiments.

Various exemplary embodiments will be described more fully hereinafter with reference to the accompanying drawings, in which some exemplary embodiments are shown. The present invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to some example embodiments.

Referring to FIG. 1, an electronic system 10 includes a host 20 and a memory system 30. The memory system 30 includes a memory controller 100 and a plurality of memory devices 200a~200n.

The host 20 may communicate with the memory system 30 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 20 may communicate with the memory system 30 through interface protocols such as Universal Serial Bus (USB), Multi-Media Card (MMC), Enhanced Small Disk Interface (ESDI), or Integrated Drive Electronics (IDE).

The memory controller 100 controls overall operation of the memory system 30. The memory controller 100 controls overall data exchange between the host 20 and the memory devices 200a~200n. For example, the memory controller 100 writes data in the memory devices 200a~200n or reads data from the memory devices 200a~200n in response to request from the host 20.

In addition, the memory controller 100 issues operation commands to the memory devices 200a~200n for controlling the memory devices 200a~200n. These commands may include read, write and refresh commands. The commands may be issued in the form of transmitting a command code to identify the command along with an address, identifying a memory location. For some operations, such as some refresh operations, the command may be issued in the form a command code only and one or more addresses may be provided internally by the memory device, or issued in the form of a command code with an address which is used by the memory device to generate multiple addresses corresponding to the command (e.g., as a start address for a burst refresh operation for multiple addresses generated by an internal counter of the memory device).

In some embodiments, the each of the memory devices 200a~200n may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc., or may be other volatile memory devices that may include a refresh operation. In some embodiments, one or more of the memory devices may be a non-volatile memory device in which a data refresh operation or similar operation may useful some time period, such as a data copyback operations responsive to determining that read disturbances may have altered programming states of a NAND flash memory device.

Figure 2:
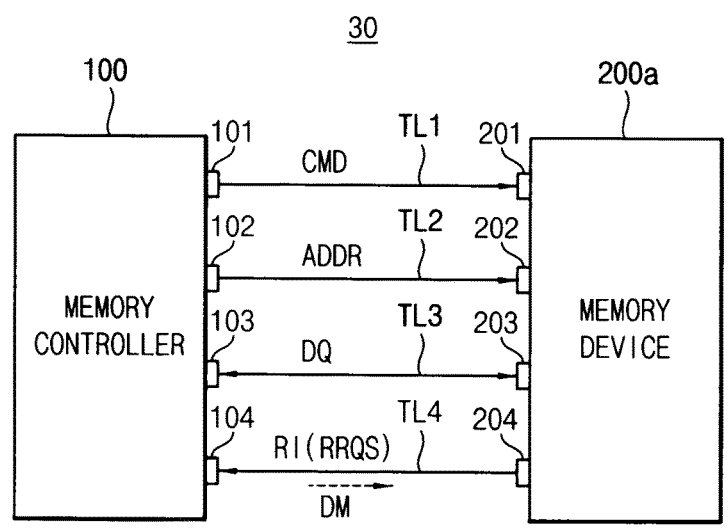
FIG. 2 is a block diagram illustrating an example of the memory system in FIG. 1 according to an embodiment.

FIG. 2 is a block diagram illustrating an example of the memory system in FIG. 1 according to an embodiment.

In FIG. 2, only one memory device 200a in communication with the memory controller 100 is illustrated for convenience. However, the details discussed herein related to memory device 200a may equally apply to the other memory devices 200b~200n.

Referring to FIG. 2, the memory system 30 includes the memory controller 100 and the memory device 200a. Each of the memory controller 100 and the memory device 200a may be formed as a separate semiconductor chip or as a separate group of chips (e.g., memory device 200a may a stack of semiconductor chips in a semiconductor package). The memory controller 100 and the memory device 200a may be connected to each other through corresponding command pins 101 and 201, corresponding address pins 102 and 202, corresponding data pins 103 and 203 and corresponding separate pins 104 and 204. The command pins 101 and 201 transmit a command signal CMD through a command transmission line TL1, the address pins 102 and 202 transmit an address signal ADDR through an address transmission line TL2, the data pins 103 and 203 exchange data DQ through a data transmission line TL3 and the separate pins 104 and 204 transmit refresh information signal RI through a separate transmission line TL4. The refresh information signal may include a refresh request signal RRQS and a refresh request address RRQ_ADDR as will be described below. For ease of description, for each of the memory controller 100 and memory device 200a, only a single pin and associated transmission line is shown and described for each of the command signal CMD, address signal ADDR, data signal DQ and data mask signal DM/Refresh Request Information RI. However, multiple pins (and corresponding transmission lines) may be used to transmit and receive these signals. Further, other pin/transmission line arrangements may be utilized, such as pins/transmission lines that each transmit and/or receive two or more of address, data and command information (e.g., command/address pins (CA) for the communication of command and address information over shared transmission lines). In addition, the use of the word pins is used in the generic sense and should not be considered limited to prong type connectors, but includes any communication terminals of a semiconductor device, such as solder bumps or solder balls in a ball grid array package for electrical communication of signals, and optical terminals for transmitting and receiving optical signals, etc.

Referring to FIGS. 1 and 2, the memory controller 100 may input data to the memory device 200a or may output data from the memory device 200a through the data pins 103 and 203 based on the request from the host 20. In addition, the memory controller 100 may receive a refresh request signal RRQS from the memory device 200a through the separate pins 104 and 204. Alternatively, the refresh request signal RRQS may be sent from the memory device 200a to the memory controller 100 via the data pins 103 and 203 and data transmission line TL3. The memory controller 100 may receive the refresh request address RRQ_ADDR through the data transmission line TL3. Refresh information signal RI may include the refresh request signal RRQS and one or more refresh request addresses RRQ_ADDR. In some embodiments, the separate pins 104 and 204 and the separate transmission line TL4 may be dedicated pins and dedicated transmission line for transmitting only the refresh information signal RI (dedicated for transmitting all or some of the refresh information signal RI). In some embodiments, the separate pins 104 and 204 may be used to transmit the both the refresh request signal RRQS and one or more refresh request addresses RRQ_ADDR. In some embodiments, the separate pins 104 and 204 may be data mask pins and the separate transmission line TL4 may also be used to transmit a data mask signal DM in addition to at least some of the refresh information signal (e.g., such as the refresh request signal RRQS). The data mask signal DM may be processed by the memory device 200a to prevent writing of information to certain memory locations during write operations to the memory device 200a that would otherwise be written to without the data mask signal. More particularly, the separate pins 104 and 204 and the separate transmission line TL4 may transmit the data mask signal DM (e.g., high level) from the memory controller 100 to the memory device 200a in write operations of the memory device 200a, may transmit a logic low signal from the memory controller 100 to the memory device 200a in read operations of the memory device 200a and may transmit the refresh request signal RRQS (e.g., logic high) from the memory device 200a to the memory controller 100 in refresh request operations of the memory device 200a.

When the memory system 30 performs a write operation, write data DQ may be transmitted from the memory controller 100 to the memory device 200a through the data transmission line TL3 and the data mask signal DM (e.g. at a logic high level) may be transmitted from the memory controller 100 to the memory device 200a through the separate transmission line TL4. When the memory system 30 performs a read operation, read data DQ may be transmitted from the memory device 200a to the memory controller 100 through the data transmission line TL3 and the separate transmission line TL4 may be used by the memory controller 100 to transmit a logic low level to the memory device 200a.

When the memory device requests a refresh operation, the refresh request signal RRQS (e.g., logic high) may be transmitted to the memory controller 100 through the separate transmission line TL4, and the refresh request address RRQ_ADDR may be transmitted to the memory controller 100 through the data transmission line TL3.

The memory controller 100 performs command scheduling for the memory device 200a transmits an appropriate command signal CMD to the memory device 200a according to the performed command scheduling for controlling the memory device 200a. The memory controller may be responsive to the received refresh information signal RI when performing command scheduling for the memory device.

Figure 3A:
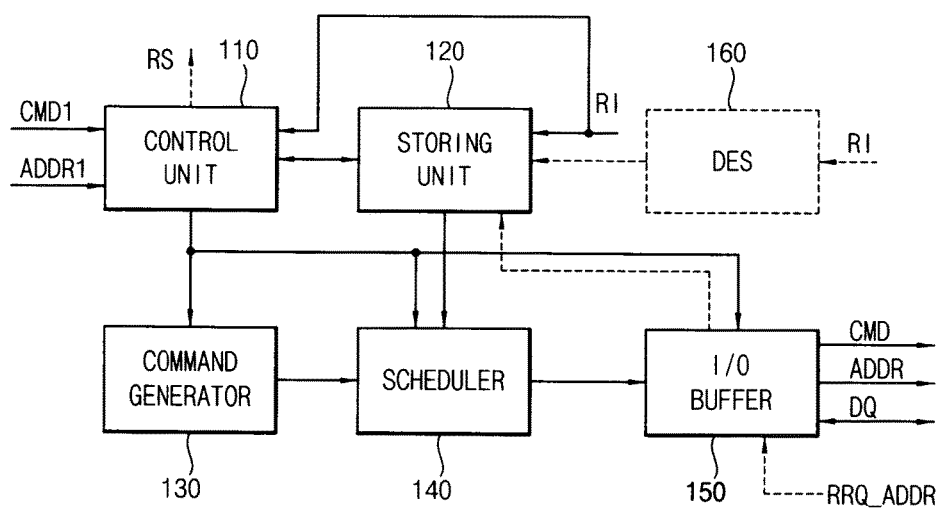
FIGS. 3A and 3B are a block diagrams illustrating examples of memory controllers.

FIG. 3A is a block diagram illustrating an example of the memory controller in FIG. 2 according to an embodiment.

Referring to FIG. 3A, the memory controller 100 may include a control unit 110, a storing unit 120, a command generator 130, a scheduler 140 and an input/output (I/O) buffer 150. In addition, the memory controller 100 may further include a deserializer 160.

The command generator 130 generates command signals to provide the command signals to the scheduler 120 under control of the control logic 110 such that the memory device 200a performs various operations, such as active, read and write operations.

The storing unit 120 stores the refresh request address RRQ_ADDR of the refresh information signal RI from the memory device 200a and provides the refresh request address RRQ_ADDR to the scheduler 140. In some embodiments, the refresh request signal RRQS of the refresh information signal RI may be transmitted to the control unit 110 and the refresh request address RRQ_ADDR may be temporarily stored in the I/O buffer 150, may be stored in the storing unit 120 and may be provided to the scheduler 140.

The control unit 110 controls the command generator 130 to generate the command signal bases on a command signal CMD1 and an address signal ADDR1 from the host 20 such that the memory device 200a performs various operations, such as active, read and write operations. In addition, the control unit 110 controls the storing unit 120 such that the refresh request address RRQ_ADDR is provided to the scheduler 140 in response to the refresh request signal RRQS of the refresh information signal RI from the memory device 200a and controls the scheduler 140 such that the scheduler 140 performs the command scheduling by including the refresh request address RRQ_ADDR. In addition, the control logic 110 may transmit a response signal RS to the memory device 220a, e.g., when the memory device 220a is included in a memory module. The scheduled command signal in the scheduler 140 is provided to the I/O buffer 150. The commands scheduled in the scheduler may include commands generated in response to and/or command sequences responsive to the refresh request address RRQ_ADDR (or the refresh request signal RI). Multiple commands may be stored in a command queue (e.g., of the scheduler 140) for sequential issuance by the memory controller 100 (e.g., at a timing determined by the scheduler via the I/O buffer 150).

For example, the scheduler 140 may perform the command scheduling such that a refresh request address for a weak cell of the refresh request address RRQ_ADDR, whose data retention time is shorter than normal cells, is prior to a refresh request address for the normal cell. In addition, the scheduler 140 may perform the command scheduling such that a refresh operation is not performed when a refresh request address of the refresh request address RRQ_ADDR is the same as a write address of a write command provided from the command generator 130 (which indicates a write to this address is to be performed).

The I/O buffer 150 may temporarily store signals that are to be transmitted to the memory device 200 or that are transmitted from the memory device 200a. The memory device 200a is connected to the I/O buffer 150 through the command pin 101, the address pin 102, the data pin 103 and the separate pin 104. The memory controller 100 may transmit data, address signals and operating command signals to the memory device 200a.

The deserializer 160 deserializes the refresh information signal RI when in packet type into the refresh request address RRQ_ADDR and the refresh request signal RRQS, provides the refresh request address RRQ_ADDR to the storing unit 120 and provides the refresh request signal RRQS to the control unit 110.

Figure 4:
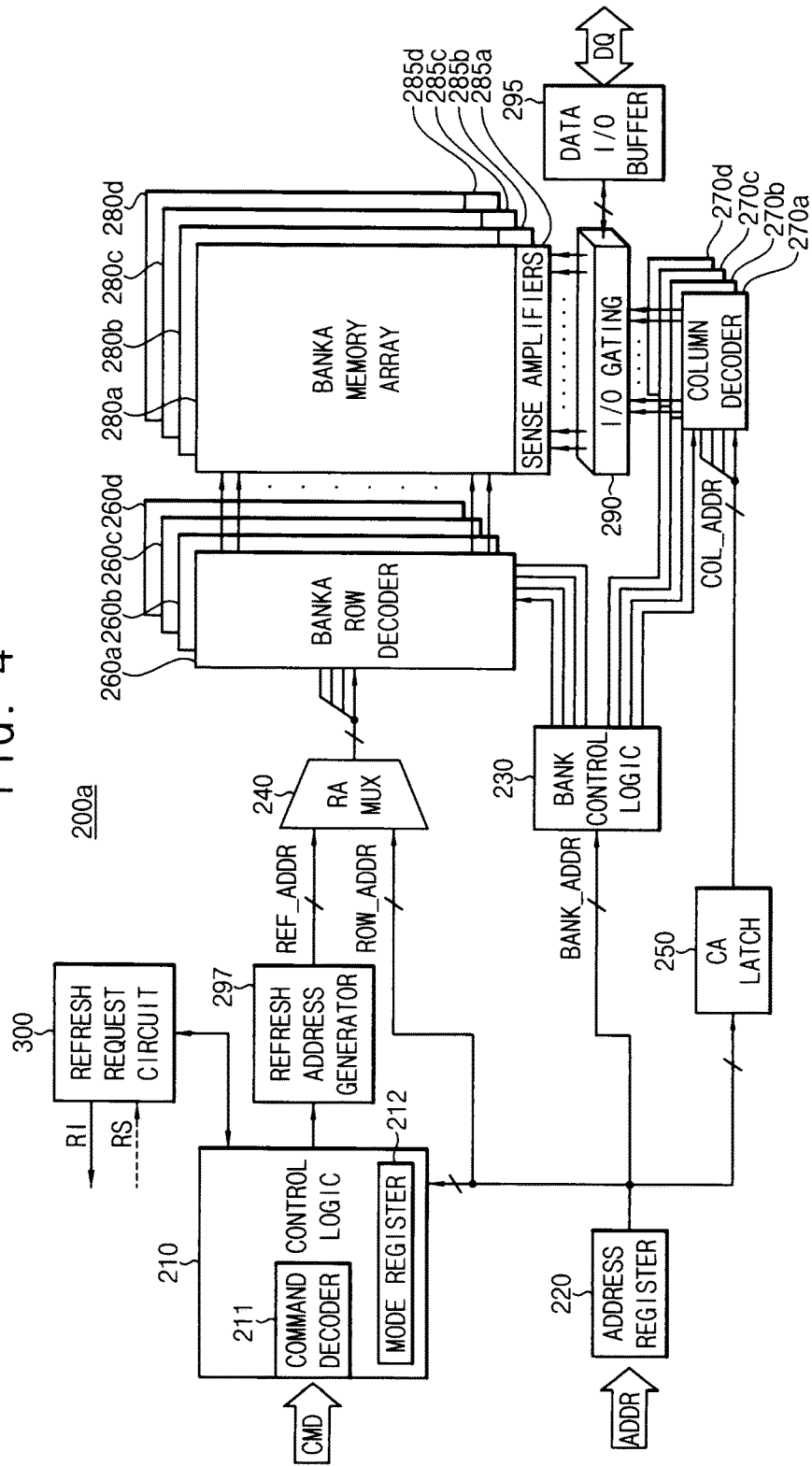
FIG. 4 is a block diagram illustrating an example of the memory device in FIG. 2 according to some example embodiments.

FIG. 4 is a block diagram illustrating an example of the memory device in FIG. 2 according to some example embodiments.

Referring to FIG. 4, the memory device 200a includes a control logic 210, an address register 220, a bank control logic 230, a row address multiplexer 240, a column address latch 250, a row decoder, a column decoder, a memory cell array, a sense amplifier unit, an input/output gating circuit 290, a data input/output buffer 295, a refresh address generator 297 and a refresh request circuit 300. In some embodiments, the memory device 200a may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc., or may be other volatile memory devices that require a refresh operation.

The memory cell array may include first through fourth bank arrays 280a, 280b, 280c and 280d. The row decoder may include first through fourth bank row decoders 260a, 260b, 260c and 260d respectively coupled to the first through fourth bank arrays 280a, 280b, 280c and 280d, the column decoder may include first through fourth bank column decoders 270a, 270b, 270c and 270d respectively coupled to the first through fourth bank arrays 280a, 280b, 280c and 280d, and the sense amplifier unit may include first through fourth bank sense amplifiers 285a, 285b, 385c and 385d respectively coupled to the first through fourth bank arrays 280a, 280b, 280c and 280d. The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks. Although the volatile memory device 200 is illustrated in FIG. 4 as including four banks, the volatile memory device 200 may include any number of banks.

The address register 220 may receive an address ADDR including a bank address BANK_ADDR, a row address ROW_ADDR and a column address COL_ADDR from a memory controller (not shown). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from the address register 220, and may receive a refresh row address REF_ADDR from the refresh address generator 297. The row address multiplexer 240 may selectively output the row address ROW_ADDR or the refresh row address REF_ADDR. A row address output from the row address multiplexer 240 may be applied to the first through fourth bank row decoders 260a, 260b, 260c and 260d.

The activated one of the first through fourth bank row decoders 260a, 260b, 260c and 260d may decode the row address output from the row address multiplexer 240, and may activate a word line corresponding to the row address. For example, the activated bank row decoder may apply a word line driving voltage to the word line corresponding to the row address.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through fourth bank column decoders 270a, 270b, 270c and 270d.

The activated one of the first through fourth bank column decoders 270a, 270b, 270c and 270d may decode the column address COL_ADDR output from the column address latch 250, and may control the input/output gating circuit 290 to output data corresponding to the column address COL_ADDR.

The input/output gating circuit 290 may include circuitry for gating input/output data. The input/output gating circuit 290 may further include an input data mask logic, read data latches for storing data output from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the one bank array, and may be stored in the read data latches. The data DQ stored in the read data latches may be provided to the memory controller via the data input/output buffer 295. Data DQ to be written to one bank array of the first through fourth bank arrays 280a, 280b, 280c and 280d may be provide from the memory controller to the data input/output buffer 295. The data DQ provided to the data input/output buffer 295 may be written to the one array bank via the write drivers.

The control logic 210 may control operations of the memory device 200a. For example, the control logic 210 may generate control signals for the memory device 200a to perform a write operation or a read operation. The control logic 210 may include a command decoder 211 that decodes a command CMD received from the memory controller and a mode register 212 that sets an operation mode of the volatile memory device 200. For example, the command decoder 211 may generate the control signals corresponding to the command CMD by decoding a write enable signal (/WE), a row address strobe signal (/RAS), a column address strobe signal (/CAS), a chip select signal (/CS), etc. The command decoder 211 may further receive a clock signal (CLK) and a clock enable signal (/CKE) for operating the volatile memory device 200 in a synchronous manner. The control logic 210 may control the refresh address generator 297 to generate the refresh row address REF_ADDR.

Under control of the control logic 210, the refresh request circuit 300 may transmit the refresh information signal RI including the refresh request signal RRQS and the refresh request address RRQ_ADDR to the memory controller 100 when at least some memory cells of the first through fourth bank arrays 280a, 280b, 280c and 280d should have a refresh operation. In some embodiments, the refresh request circuit 300 may transmit the refresh request signal RRQS of the refresh information signal RI to the memory controller 100 through the separate pin 204 and the separate transmission line TL4 and may transmit the refresh request address RRQ_ADDR to the memory controller 100 through the data pin 203 and the data transmission line TL3. In addition, the refresh request circuit 300 may receive a response signal RS from the memory controller 100, e.g., when the memory device 200a is included in a memory module.

Figure 5:
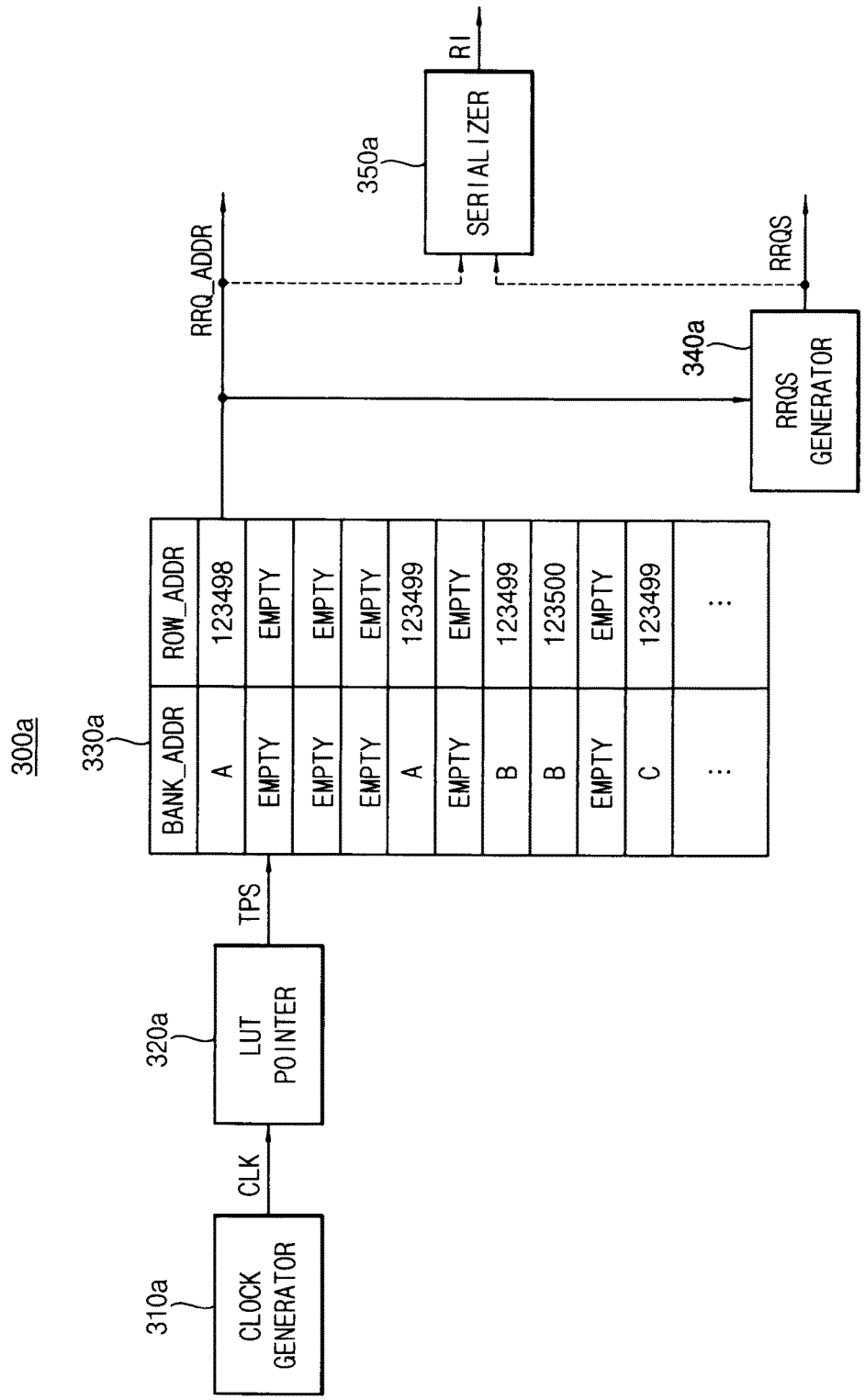
FIG. 5 is a block diagram illustrating an example of the refresh request circuit in FIG. 4 according to an example embodiment.

FIG. 5 is a block diagram illustrating an example of the refresh request circuit 300 in FIG. 4 according to an example embodiment.

Referring to FIG. 5, a refresh request circuit 300a may include a clock generator 310a, a look-up table (LUT) pointer 320a, a LUT 330a and a refresh request signal generator 340a. The refresh request circuit 300a may further include a serializer 350a.

The clock generator 310a generates a clock signal CLK. The LUT pointer 320a generates a table pointing signal TPS indicating the refresh request addresses by gradually increasing table addresses of the LUT 330a in synchronization with the clock signal CLK. The LUT pointer 320a provides the table pointing signal TPS to the LUT 330a. For example, the LUT pointer 320a may increment by one the table pointing signal TPS from 0 to N every clock cycle (or every half clock cycle) and output the table pointing signal TPS as an address of the LUT 330a to access information stored at the table pointing signal TPS address of the LUT 330a (e.g., to access one or more refresh request addresses RRQ_ADDR stored at the table address indicated by the table pointing signal TPS). After the last entry of the LUT 330a (e.g., TPS=N), the table pointing signal TPS may be returned or reset to the first address (e.g., reset to TPS=0) and the incrementing process may be restarted. Incrementing the table pointing signal TPS may occur at a desired refresh period, such as every 3.9 microseconds. The time period between incrementing the table pointing signal may be large enough to allow for the memory controller to issue a large number of commands to the memory, such as at least 20, at least 100, at least 500 or at least 1000 commands. Alternatively and/or in addition, the table pointing signal TPS may be incremented so that the entire table is read (e.g., all of the 0 to N entries of the LUT 330a) within a minimum refresh period of or multiple minimum refresh periods of normal cell rows of the memory device 200a. For example, the entire table may be read every 32 ms, every 64 ms or every 96 ms. For example, a table entry may be read every (refresh period)/N if there are N table entries.

The LUT 330a stores refresh request addresses RRQ_ADDR according to order of memory cell rows to be refreshed based on the data retention time of the memory cells. The data retention time of the memory cells may be determined during testing, such as during manufacturing of the memory device (e.g., after making a semiconductor memory chip prior to packaging or after packaging). For example, a memory chip may be subjected to testing to determine or analyze a data retention time for each memory cell row of the memory chip. The data retention time may correspond to a time when the memory cell row may still be read without data loss. Thus, one or a few weak cells of a memory cell row may make the memory cell row a weak cell row even if other data cells have normal data retention times. The weak cell rows may be any rows of the memory device that exhibit less than normal data retention times as result from the manufacturing process. Thus, the weak cell rows may be interspersed among normal cell rows in the same bank of the memory device (e.g., a weak cell row may have one or two normal cell rows as immediate neighboring rows to the weak cell row). The organization of the refresh request addresses RRQ_ADDR within the LUT 330a may be such to cause output of a refresh request address RRQ_ADDR for memory cell rows to achieve a refresh operation within a period less than the data retention time of each corresponding row. The LUT 330a may store the addresses of all rows of the memory device, with some of the rows having more entries than other rows. For example, the LUT 330a may store addresses of normal rows such that the normal rows are each refreshed at a standard rate upon access of the LUT 330a by LUT pointer 320a, and may store addresses of weak cell rows so that each are refreshed at one or more rates that are higher than the standard rate (e.g., by storing a weak cell row address in several entries of the LUT 330a at entry locations more closely spaced in the LUT 330a than a normal row). In an alternative embodiment, rows of the memory device may be assessed during testing on a scale of weak to strong, such that even cell rows that otherwise may be considered standard (e.g., corresponding to normal cell rows), are refreshed at different refresh rates due to row address organization in the LUT 330a (e.g., the cell rows may be categorized in at least 5 or at least 10 or at least 20 different data retention time groups, with refresh scheduling of a memory cell row based on its categorization). Alternatively, the LUT 330a may store just the addresses of the weak cell rows of the memory device having data retention times less than normal cell rows of the memory device, and normal cell row refresh operations may be initiated by circuitry outside the LUT 330a. Normal cell rows of the memory device may be those rows in which the data retention time is at least as long as a standard retention time (e.g., as set by the memory device designer or manufacturer). The LUT 330a may output a refresh request address RRQ_ADDR, including a bank address BANK_ADDR (e.g. A, B, C, or D) and a row address ROW_ADDR (e.g. 123498, 123499, 123500, etc.), designated by a table address indicated by the table pointing signal TPS. In the LUT 330a, a table address denoted by 'EMPTY' designates no refresh request address. When the table pointing signal TPS indicates 'EMPTY' in the LUT 330a, no request information RI may be output (e.g., neither the refresh request address RRQ_ADDR or refresh request signal RRQS may be output).

In addition, the LUT 330a may provide one particular bank address of the first through fourth bank arrays 280a, 280b, 280c and 280d in FIG. 4 as the refresh request address RRQ_ADDR to the memory controller 100. In this case, the refresh request address RRQ_ADDR including the particular bank address is transmitted to the memory controller 100 a few cycles before the desired timing of the refresh cycle, and the memory controller 100 controls the memory device 200a such that refresh operation is performed for the designated bank. For example, in response to the LUT 330a outputting a first refresh request address RRQ_ADDR1 with a refresh request signal RRQS to the memory controller 100 the memory controller 100 may provide a refresh command to the memory device 200a to instruct the memory device 200a to perform a refresh operation for the row identified by RRQ_ADDR1. The refresh command may be inserted at the next available command slot in the command queue (e.g., of scheduler 140). If no command slots of the command queue are available within a predetermined time (e.g., to a time to assure a refresh operation occurs within a minimum time period from receiving the request information RI from the memory device 200a), the scheduler 140 of the memory controller 100 may interrupt a command sequence of the command queue and insert the refresh command for row RRQ_ADDR1 into the command queue (e.g., revise a command queue sequence of commands) and delay issuance of commands of the command queue having a lower priority or later position in the command queue, which may assure issuance of the refresh command and/or the refresh operation within the desired timing for row RRQ_ADDR1. Alternatively, the refresh command for row RRQ_ADDR1 may be made the next issued command in the command queue and with all previously scheduled non-issued commands in the command queue delayed to later command slots in the command queue.

The refresh request signal generator 340a may generate the refresh request signal RRQS whenever the LUT 330a outputs the refresh request address RRQ_ADDR. Alternatively, the refresh request signal generator 340a may generate the refresh request signal RRQS whenever the LUT 330a outputs a predetermined number of the refresh request addresses RRQ_ADDR. Alternatively, the refresh request signal generator 340a may generate the refresh request signal RRQS whenever the LUT 330a outputs a predetermined number of the refresh request addresses RRQ_ADDR or when a minimum time period has been reached before the predetermined number of refresh addresses RRQ_ADDR have been output by the LUT 330a and at least one refresh address RRQ_ADDR has been output by the LUT 330a. Alternatively, the refresh request signal generator 340a may generate the refresh request signal RRQS every predetermined time period whenever the LUT 330a outputs at least one of the refresh request addresses RRQ_ADDR.

The serializer 350a may serialize the refresh request signal RRQS and one or more of the refresh request addresses RRQ_ADDR into one packet when the refresh information signal RI is transmitted to the memory controller in a packet type. In some embodiments, the refresh information signal RI in packet type may include the refresh request signal RRQS and one refresh request address RRQ_ADDR or may include the refresh request signal RRQS and a plurality of request addresses RRQ_ADDR. Alternatively, the serializer 350a may serialize the one or more of the refresh request addresses RRQ_ADDR of the request information signal and separately transmit the refresh request signal RRQS from the packetized one or more refresh request addresses RRQ_ADDR. Alternative embodiments may not include a serializer for reformatting any of the request information signal RI. This may include transmitting each refresh request addresses RRQ_ADDR along with a refresh request signal RRQS in parallel on plural transmission lines TL.

Figure 6:
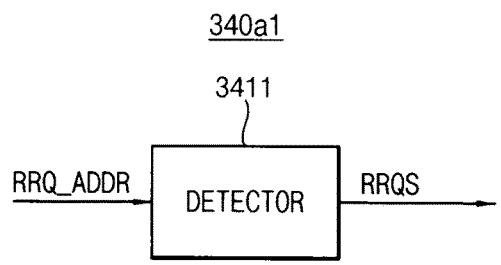
FIG. 6 is a block diagram illustrating an example of the refresh request signal generator in FIG. 5 according to an example embodiment.

FIG. 6 is a block diagram illustrating an example of the refresh request signal generator 340a in FIG. 5 according to an example embodiment.

Referring to FIG. 6, a refresh request signal generator 340a1 may include a detector 3411. The detector 3411 detects an output of the refresh request address RRQ_ADDR from LUT 330a. The detector 3411 may output the refresh request signal RRQS that is activated whenever the output of the refresh request address RRQ_ADDR from LUT 330a is detected.

Figure 7:
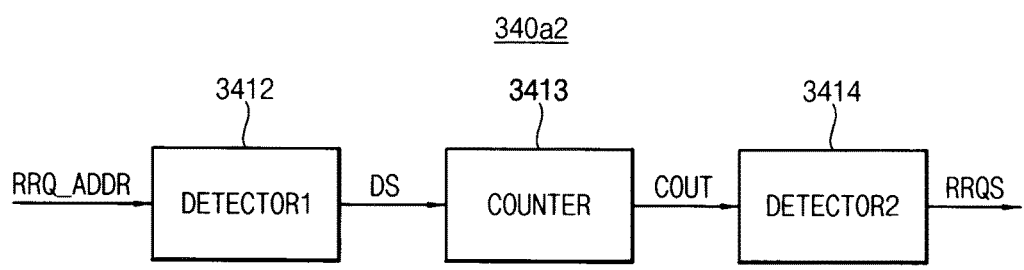
FIG. 7 is a block diagram illustrating an example of the refresh request signal generator in FIG. 5 according to another example embodiment.

FIG. 7 is a block diagram illustrating an example of the refresh request signal generator 340a in FIG. 5 according to another example embodiment.

Referring to FIG. 7, a refresh request signal generator 340a2 may include a first detector 3412, a counter 3413 and a second detector 3414. The first detector 3412 detects an output of the refresh request address RRQ_ADDR from the LUT 330a (and input to the detector 3412) to output a detection signal DS that is activated (e.g., pulsed) whenever the refresh request address RRQ_ADDR is output from the LUT 330a. The counter 3413 counts the number of times the detection signal DS is activated to output a counting signal COUT indicating a number of refresh request addresses RRQ_ADDR output from the LUT 330a. The second detector 3414 may output the refresh request signal RRQS when the counting signal COUT matches with a predetermined number. For example, the predetermined number may be one of 1, 11 and 21, etc. Therefore, the refresh request signal generator 340a2 may transmit to the memory controller 100 the refresh request signal RRQS that is enabled when a predetermined plurality of number of the refresh request addresses RRQ_ADDR are output. In an alternative embodiment, the second detector 3414 may receive an input from a timer (not shown) providing a timing signal that is activated a predetermined time from the output of the last refresh request signal RRQS. The second detector 3414 may output the refresh request signal RRQS whenever either (a) a predetermined number of the refresh request addresses RRQ_ADDR have been output by the LUT 330a (as indicated by COUT) since the last refresh request signal RRQS has been output or (b) the second detector 3414 has received the timing signal (indicating a predetermined time has elapsed from the output of the last refresh request signal RRQS and at least one refresh request address RRQ_ADDR has been output by the LUT 330a (e.g. COUT is equal to one or more). The timer may be reset to restart its timer and COUT may be reset to 0 by the output of the refresh request signal RRQS.

Figure 8:
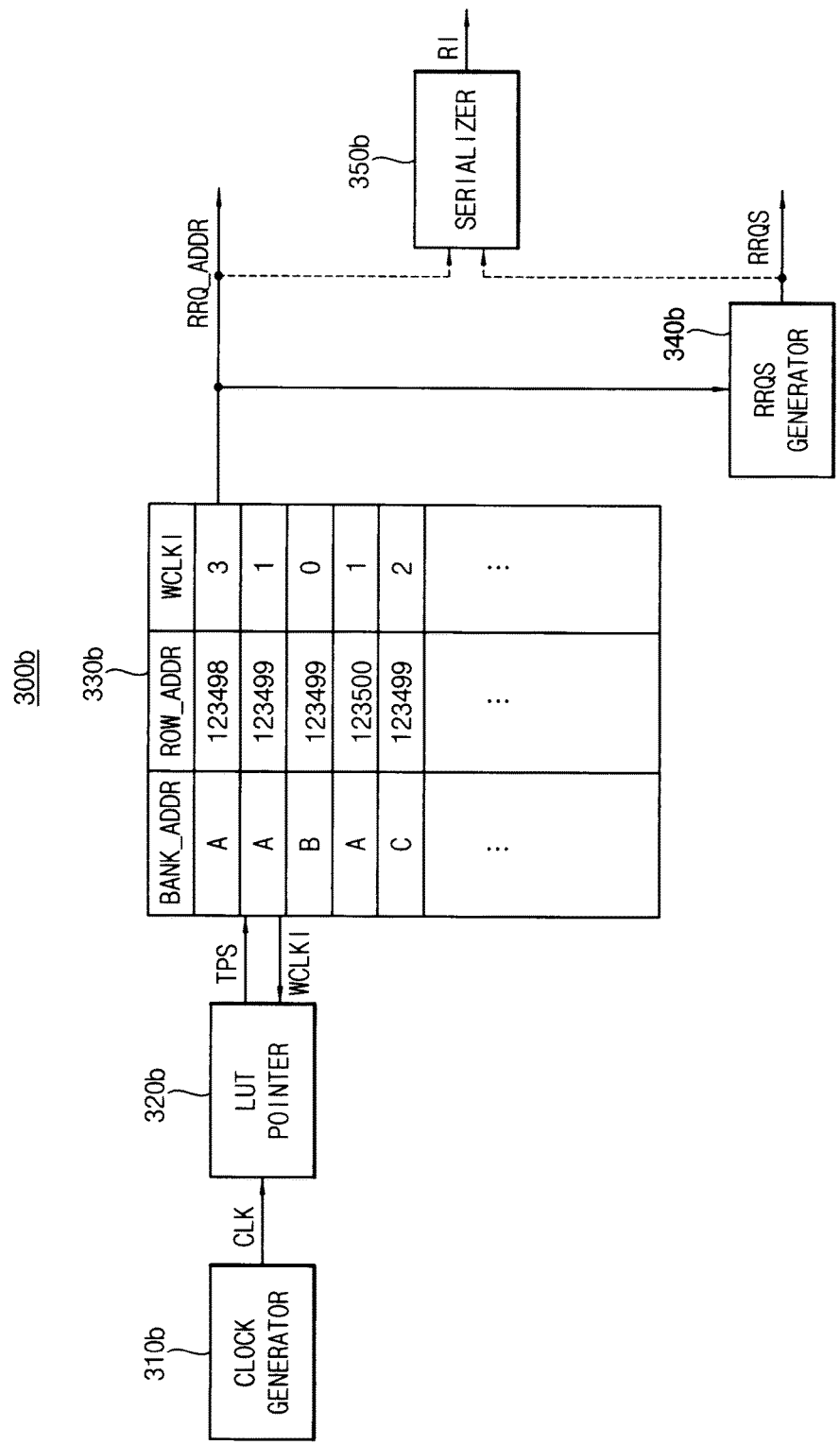
FIG. 8 is a block diagram illustrating an example of the refresh request circuit in FIG. 4 according to another example embodiment.

FIG. 8 is a block diagram illustrating an example of the refresh request circuit 300 in FIG. 4 according to another example embodiment.

Referring to FIG. 8, a refresh request circuit 300b may include a clock generator 310b, a LUT pointer 320b, a LUT 330b and a refresh request signal generator 340b. The refresh request circuit 300b may further include a serializer 350b.

The clock generator 310b generates a clock signal CLK. The LUT pointer 320b generates a table pointing signal TPS indicating the refresh request addresses by gradually increasing table addresses of the LUT 330b in synchronization with the clock signal CLK and in accordance with delays provided by the LUT 330b. The LUT pointer 320b is controlled to delay a regular increment period Tp by an extra Tp×WCLKI, where WCLKI is a wait clock information value. For example, the LUT pointer 320b may be set to increment every clock cycle CLK when wait clock information WCLK1 is equal to zero. When the wait clock information WCLKI is equal to an integer n, the next increment of the LUT pointer 320b may be (n+1)×Tpclk where Tpclk is the time of one period of the clock CLK. The wait clock information WCLKI for determining the next increment of the LUT pointer 320b may be part of entry of the LUT 330b identified by the current value of the LUT pointer 320b. For example, in the example of FIG. 8, the wait clock information WCLKI of 3 at the first entry of the LUT 330b may indicate a delay of an extra three clock cycles (in addition to the standard delay of one clock cycle) until the LUT pointer 320b is incremented to a table pointing signal TPS identifying the second entry of the LUT 330b. Thus, four clock cycles may occur until the table pointing signal TPS is incremented from a value (e.g., table address=0) identifying table entry storing RRQ_ADDR of BANK_ADDR A, ROW_ADDR 123498 to a value identifying table entry storing RRQ_ADDR of BANK_ADDR A, ROW_ADDR 123499 (e.g., table address=1).

The LUT pointer 320b provides the table pointing signal TPS to the LUT 330b. The LUT 330b stores refresh request addresses in an order of memory cell rows to be refreshed based on the data retention time of the memory cells (which may be the same as described above with respect to FIG. 5) and stores the wait clock information WCLKI (e.g. 0, 1, 2, 3, etc.) for designating output timing of the subsequent refresh request address RRQ_ADDR. The LUT 330b outputs as the refresh request address RRQ_ADDR a bank address BANK_ADDR (e.g. A, B, C, or D) and a row address ROW_ADDR (e.g. 123498, 123499, 123500, etc.) designated by a table address indicated by the table pointing signal TPS.

The refresh request signal generator 340b may generate the refresh request signal RRQS as described with respect to refresh request signal generator 340a of the embodiment of FIG. 5, such as being activated whenever the LUT 330b outputs the refresh request address RRQ_ADDR and/or the LUT 330b outputs a predetermined number of the refresh request addresses RRQ_ADDR and/or a predetermined time period has past with at least one refresh request address RRQ_ADDR being output by the LUT 330b.

The serializer 350b serializes the refresh request signal RRQS and the refresh request address RRQ_ADDR to one packet when the refresh information signal RI including the refresh request signal RRQS and the refresh request address RRQ_ADDR is transmitted to the memory controller in a packet type. In some embodiments, the refresh information signal RI in packet type may include the refresh request signal RRQS and one refresh request address RRQ_ADDR or may include the refresh request signal RRQS and a plurality of request addresses RRQ_ADDR. Alternatively, serializer 350b may also operate as described with respect to serializer 350a of FIG. 5 or be removed as described with respect to FIG. 5.

Figure 9:
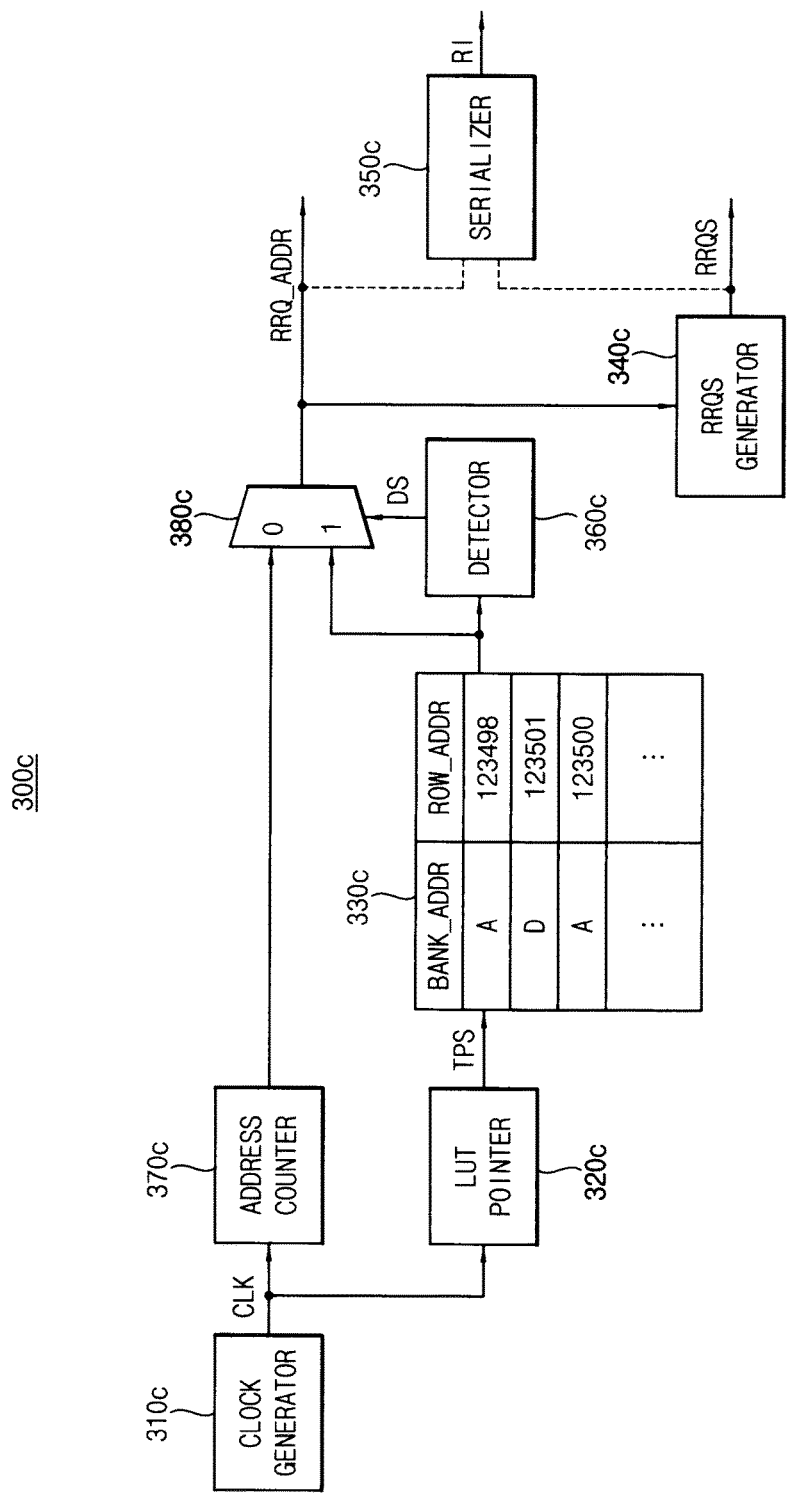
FIG. 9 is a block diagram illustrating an example of the refresh request circuit in FIG. 4 according to still another example embodiment.

FIG. 9 is a block diagram illustrating an example of the refresh request circuit 300 in FIG. 4 according to still another example embodiment.

Referring to FIG. 9, a refresh request circuit 300c may include a clock generator 310c, an address counter 370c, a LUT pointer 320c, a LUT 330c, a multiplexer 380c, a detector 360c and a refresh request signal generator 340c. The refresh request circuit 300c may further include a serializer 350c.

The clock generator 310c generates a clock signal CLK. The address counter 370c generates internal refresh addresses for refreshing the memory cells of the memory device 200a in synchronization with the clock signal CLK. The LUT pointer 320c generates a table pointing signal TPS indicating the refresh request addresses by gradually increasing table addresses of the LUT 330c in synchronization with the clock signal CLK and provides the table pointing signal TPS to the LUT 330c.

The LUT 330c stores weak cell row addresses (e.g., including a bank address BANK_ADDR A, B, C, or D, and a row address ROW_ADDR 123498, 123499, 123500, or 123501, etc.) that are in order of memory cell rows to be refreshed based on the data retention time of the memory cells. The storage of these weak cell row addresses may be performed as described above with respect to FIGS. 5 and 8. The LUT 330c may only store weak cell row addresses, allowing addresses generated by address counter 320c to cause refresh of normal cell rows. The multiplexer 380c selects one of the internal refresh address from the address counter 370c and weak cell row address from the LUT 330c in response to a detection signal DS to provide the selected one (e.g. when DS is 0 from the address counter 370c and when DS is 1 from the LUT 330c) as the refresh request address RRQ_ADDR.

The detector 360c provides the detection signal DS that is activated to the multiplexer 380c whenever the weak cell row address is output (or updated) from the LUT 330c. Accordingly, the multiplexer 380c preferentially selects the weak cell row addresses of the internal refresh addresses and the weak cell row addresses. In some embodiments, upon selection of the weak cell row address by multiplexer 380c, change (e.g., incrementing) of the internal refresh address generated by the address counter 370c may be delayed to allow selection of the current internal refresh address generated by the address counter 370c by the multiplexer 380c as the next internal refresh address. This delay in incrementing and selection of the current internal refresh address generated by the address counter 370c may be performed in a time period smaller than a time period between the output of weak cell row addresses from the LUT 330c. In other embodiments, multiplexer 380c may alternatively select internal refresh addresses generated by the address counter 370c and addresses output by LUT 330c (if any). For example, during odd clock cycles, the address multiplexer 380c selects an address output by the address counter and during even clock cycles, the multiplexer 380c selects an address output by LUT 330c (the address counter 370c may be set to increment its generated address every two clock cycles). In other embodiments, multiplexer may be set to select any address output by LUT 330c for n−1 consecutive clock cycles (n being an integer two or greater), and select an address generated by the address counter 370c every nth clock cycle, where n is an integer greater than 2 (the address counter 370c may be set to increment its generated address every n clock cycles). The memory cell rows corresponding to the weak cell row addresses may be refreshed at least two times in a refresh period. The refresh request signal generator 340c may generate the refresh request signal RRQS as described with respect to refresh request signal generator 340a of the embodiment of FIG. 5, such as being activated whenever the multiplexer 380c outputs the refresh request address RRQ_ADDR and/or the multiplexer 380c outputs a predetermined number of the refresh request addresses RRQ_ADDR and/or a predetermined time period has past with at least one refresh request address RRQ_ADDR being output by the multiplexer 380c.

The serializer 350c serializes the refresh request signal RRQS and the refresh request address RRQ_ADDR to one packet when the refresh information signal RI including the refresh request signal RRQS and the refresh request address RRQ_ADDR is transmitted to the memory controller in a packet type. In some embodiments, the refresh information signal RI in packet type may include the refresh request signal RRQS and one refresh request address RRQ_ADDR or may include the refresh request signal RRQS and a plurality of request addresses RRQ_ADDR. Alternatively, serializer 350c may also operate as described with respect to serializer 350a of FIG. 5 or be removed as described with respect to FIG. 5.

In alternative embodiments, the timing of certain refresh operations for normal row addresses may be initiated by memory controller 100. For example, the memory controller 100 may assume all rows are normal rows and automatically generate refresh commands accordingly (i.e., at a normal cell row refresh timing for both normal and weak cell rows without requiring a refresh request from the memory device 200a). The memory device 200a may generate additional refresh requests for the weak cell rows to be added to those automatically generated by the memory controller 100. In this alternative example, embodiments of FIG. 5 or FIG. 8 may be used and dedicated to generation of refresh requests (and corresponding refresh commands) for weak cell rows, resulting in refresh commands for weak cell rows to be added to those refresh commands automatically generated by the memory controller 100 (which may result in more frequent refreshing of the weak cell rows). The refresh commands automatically generated by the memory controller 100 may include refresh commands for individual memory rows or burst refresh commands (resulting in a group of rows being refreshed in response to a single command). The refresh commands automatically generated by the memory controller 100 may utilize an address counter in the memory device 200a to generate addresses of the cell rows to be refreshed in response to the refresh command automatically generated by the memory controller 100.

Figure 3B:
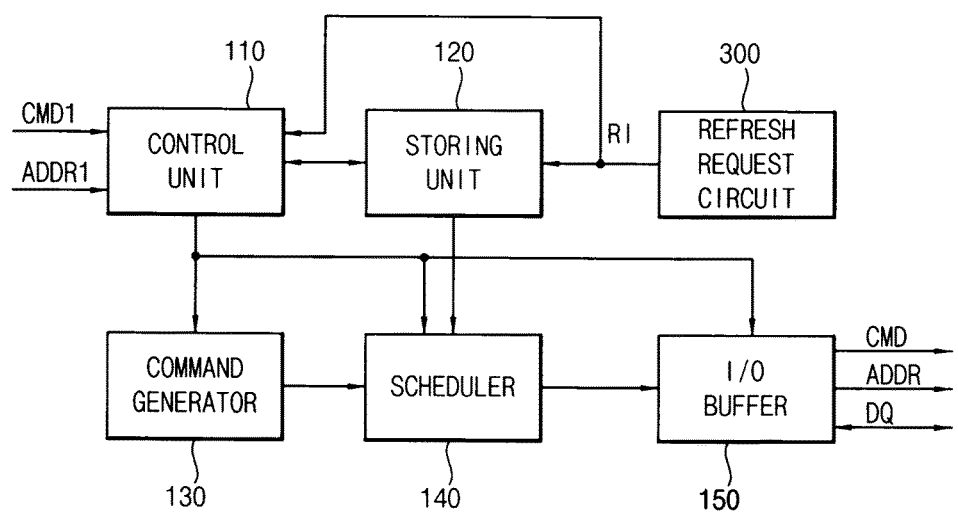

In alternative embodiments, the timing of refresh operations for both weak and normal cell rows may be initiated by the memory controller 100. FIG. 3B illustrates an exemplary memory controller 100 including the refresh request circuit 300 (which may be 300a, 300b and/or 300c described herein with respect to FIGS. 5, 8 and/or 9, e.g.). For example, the refresh request circuit 300 may be part of the same semiconductor chip that forms the memory controller 100. In this example, use of transmission lines TL, a serializer and deserializer for transmission of refresh information signals RI may be avoided. The refresh request circuit 300 may generate refresh information RI (including refresh request addresses RRQ_ADDR and refresh request signals RRQS) in a manner described herein (e.g., as described with respect to refresh request circuits 300a, 300b and/or 300c). The refresh request circuit 300 may transmit the refresh request addresses RRQ_ADDR to the storing unit 120 and refresh request signals RRQ to the control unit 110 Generation of the table entries in the LUT 330 (i.e., 330a, 330b, 300c or 330d) of the refresh request circuit 300 may be generated during a power up sequence that transfers at least weak cell row information and associated refresh timing parameters to the memory controller 100. The LUT 330 of the memory controller 100 may be associated with more than one memory device 200a when the memory controller is used to control multiple memory devices 200a. In this case, the LUT 330 may include additional information (such as tag information) indicating a row address to be refreshed with row, bank and memory device address information. As other features of these embodiments may remain the same as those embodiments previously described, repetitive description is not needed here.

Figure 10A:
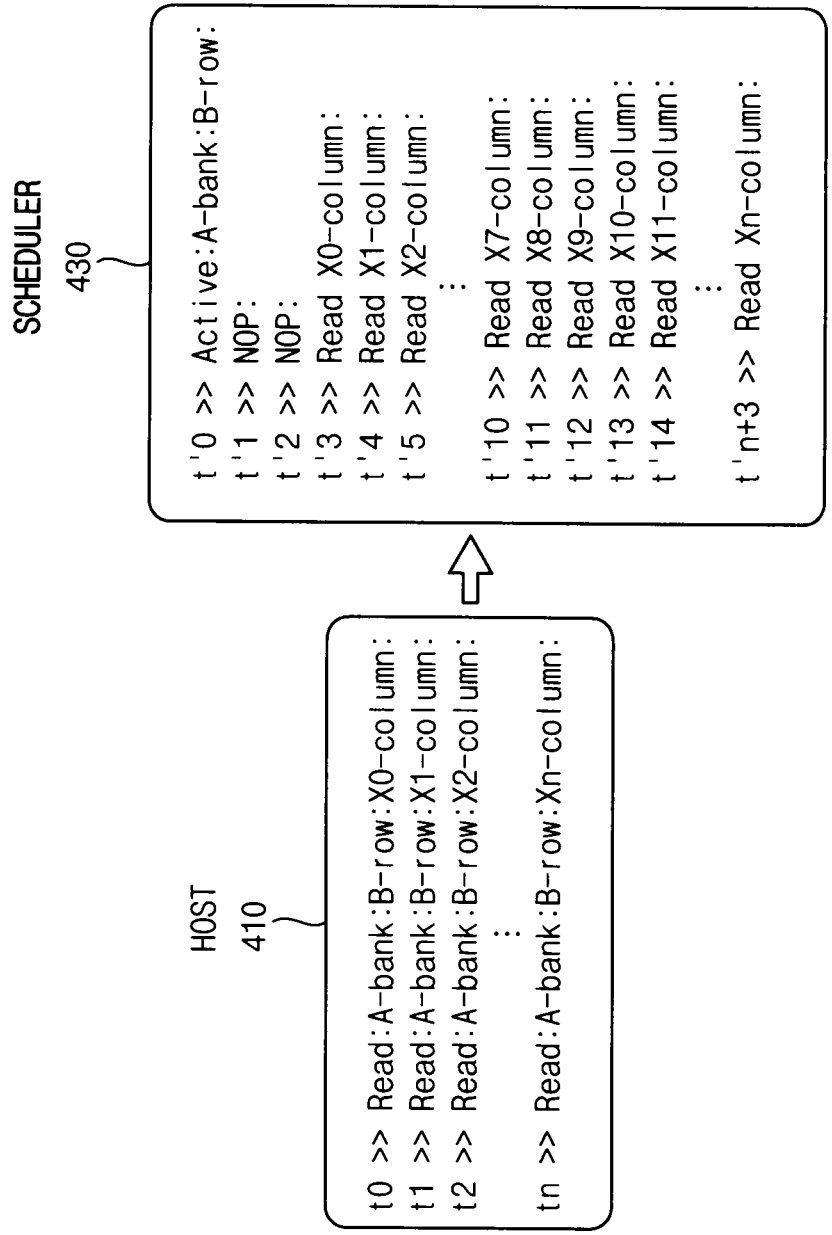
Figure 10B:
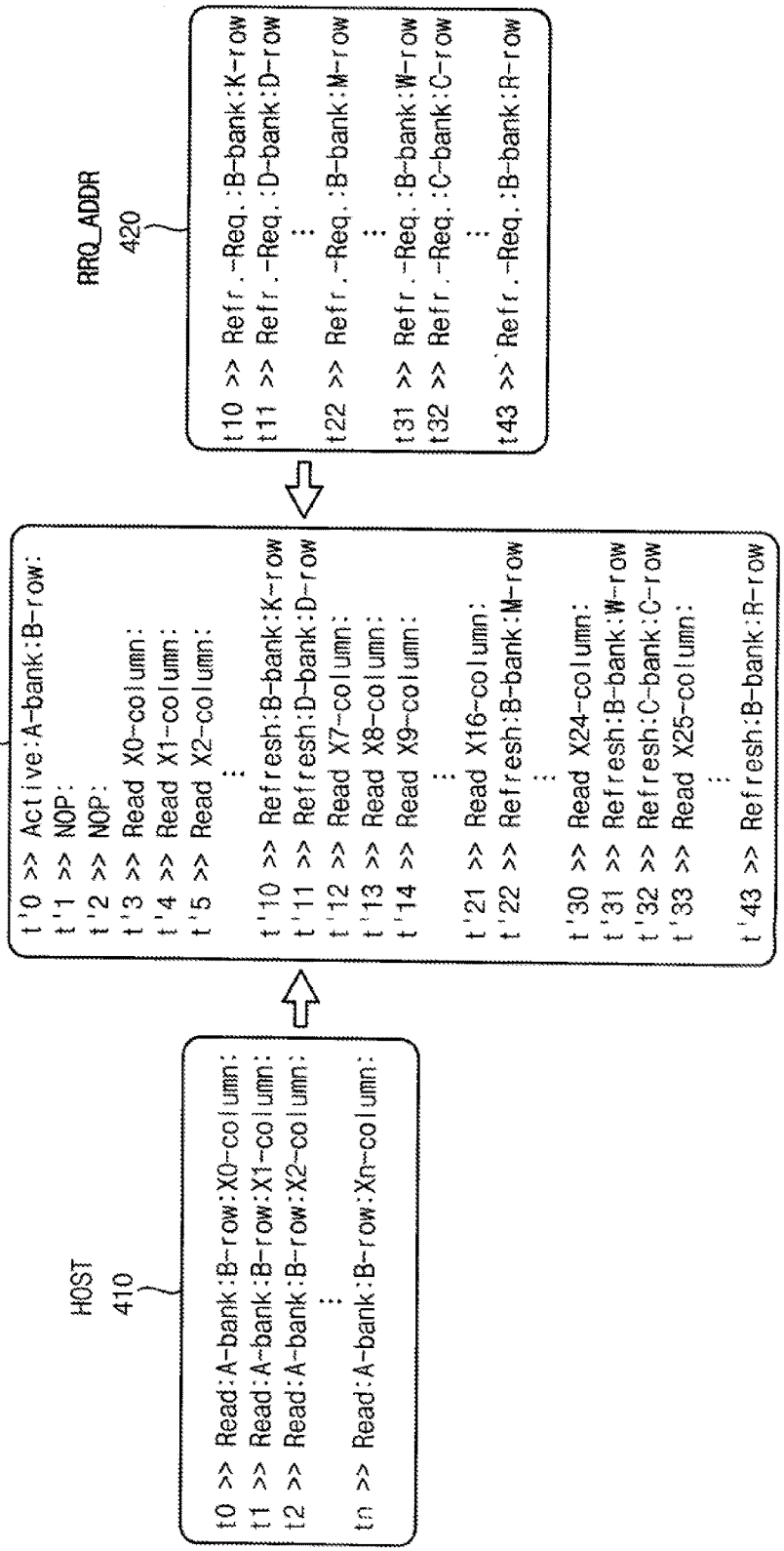

FIGS. 10A and 10B illustrate operation of the scheduler 140 in FIGS. 3A and 3B according to some example embodiments.

In FIGS. 10A and 10B, the scheduler 140 performs the command scheduling by adding to commands of a command queue 430 (generated in response to commands received from host 410), the refresh commands to a command queue 430 of the scheduler 140 according to request addresses 420 of the refresh information signal RI received from the refresh request circuit 300 of the memory device 200a. In this example, host 410 has issued a series of read commands during time periods t0 to tn to read columns X0 to Xn of row B of bank A. As shown in FIG. 10A, initially scheduler 140 schedules an active command for time t'0, two NOPs (no operation) for times t'1 and t'2 to allow the memory device 200a time to activate row B of bank A and sense data of the row B bank A memory cells (e.g., according to a row active time tRAS of the memory device 200a). Scheduler 140 also initially schedules the reading of columns X0 to Xn for issuance to the memory device 200a respectively at times t'3, t'4, t'5 . . . t'n+3. There may be a substantially fixed time delay between time tn and t'n to account for processing time of the scheduler 140.

Referring to FIG. 10B, the memory controller 100 is shown to receive several refresh requests from memory device 200a. In this example, the memory controller receives refresh requests at times t10, t11, t22, t31, t32 and t43 respectively for RRQ_ADDR addresses B-bank:K-row, D-bank:D-row, B-bank:M-row, B-bank:W-row, C-bank:C-row and B-bank:R-row. In response to receiving the refresh requests, scheduler 140 modifies the sequence of commands in the command queue 430 to include refresh operations for the received refresh request addresses RRQ_ADDR. In this example, scheduler 140 modifies the sequence of commands in the command queue 430 to issue the appropriate refresh command as soon as the next command slot is available and delays previously scheduled commands appropriately. Comparing the exemplary schedules of FIGS. 10A and 10B, read operations for columns X7 and X8 originally scheduled for issuance at time t'10 and t'11 respectively (see FIG. 10A) are now replaced with refresh commands for B-bank:K-row and D-bank:D-row (see FIG. 10B). In addition, read operations for columns X7 and X8 are now scheduled for issuance at time t'12 and t'13 with subsequent originally scheduled commands in the command queue 430 of FIG. 10A being delayed by two time periods (corresponding to the two time periods needed to schedule the two newly scheduled refresh commands). As an alternative to the modification to command queue 430 represented by FIGS. 10A and 10B, the scheduler may modify the command queue 430 to insert a refresh command for the received refresh request address RRQ_ADDR within a predetermined period of time from its receipt, such as within 5 or within 10 command slots of the command queue 430. This may allow use of empty command slots of the command queue 430 without rescheduling and delaying previously existing commands in the command queue 430.

FIG. 10C shows an alternative to FIG. 10B. In the operation represented by FIG. 10C, the refresh request address REQ_ADDR received from the memory device 200a does not include the row address of the row to be refreshed. Rather, the memory device 200a sends just the bank address portion for the refresh request address RRQ_ADDR (which may be accompanied by a refresh request signal RRQS). Scheduler 430 may issue the refresh command along with the bank address. When the refresh command and the bank address are received by the memory device 200a, the memory device refreshes the desired row of the bank identified by the received bank address. The desired row of the bank may be identified by the memory device 200a internally, such as by referencing the LUT 330a or 330b (or multiplexer 380c), a FIFO buffer receiving and storing refresh request addresses RRQ_ADDR output by the LUT 330a or 330b (or multiplexer 380c), or one of plural FIFO buffers associated with each bank receiving and storing refresh request addresses RRQ_ADDR output by the LUT 330a or 330b (or multiplexer 380c) for the corresponding associated bank. In a further alternative to the disclosed embodiments, no refresh request address REQ_ADDR need be transmitted to the memory controller. Instead, the memory device 200a may simply transmit a refresh request signal RRQS and upon receiving a refresh command, refresh one or more of the rows of memory cells as identified by the address RRQ_ADDR (generated by the refresh request circuit 300, but not sent to the memory controller 100 in this alternative embodiment). These rows of memory cells may be those cells identified as having the highest priority, or as one or more rows associated with the oldest addresses generated by the refresh request circuit 300 that have not had a refresh operation performed in response to the address generation.

Figure 11:
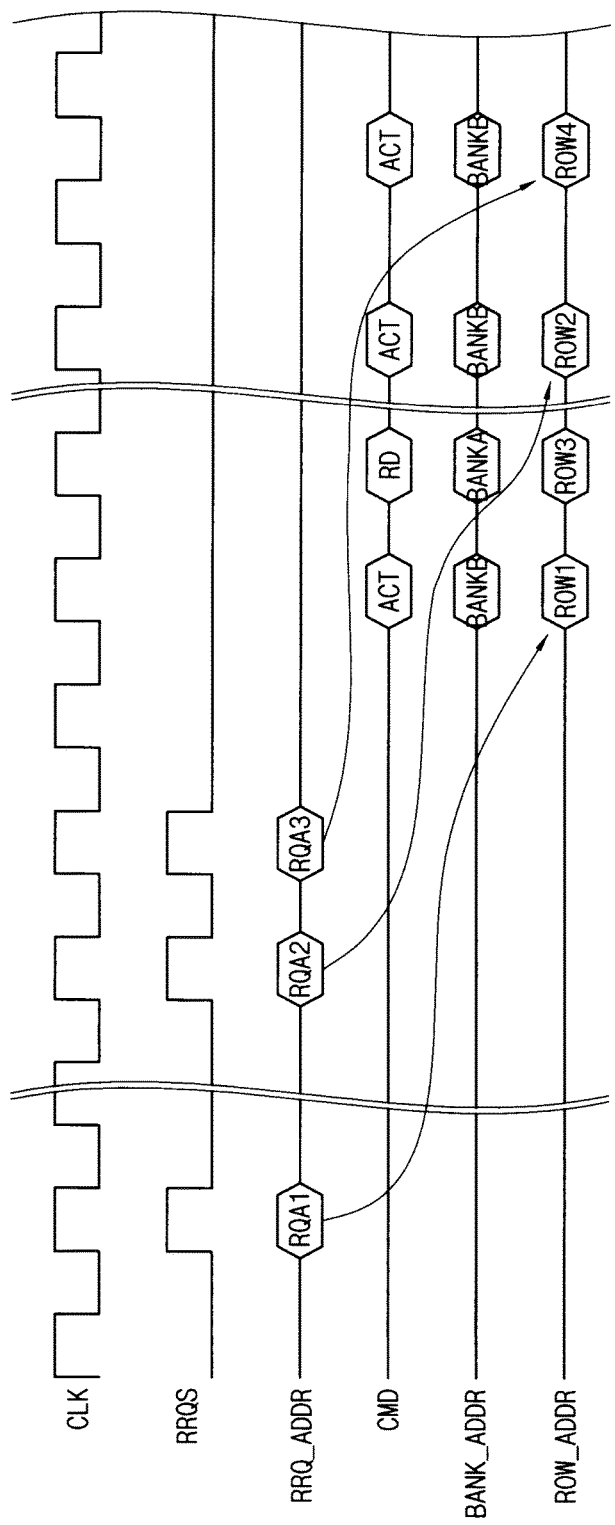
FIG. 11 is a timing diagram illustrating operation of the memory system according to some example embodiments.

FIG. 11 is a timing diagram illustrating operation of the memory system according to some example embodiments.

In FIG. 11, the refresh request signal RRQS is activated whenever a refresh request address RRQ_ADDR is output.

Referring to FIGS. 5 and 11, whenever the table address designated by the table pointing signal TPS increases, the corresponding refresh request addresses RRQ_ADDR (e.g., either RQA1, RQA2 or RQA3) is output from the LUT 330a and the refresh request signal RRQS is activated in response to one of the request addresses RRQS_ADDR RQA1, RQA2 and RQA3 being output. The scheduler 140 performs the command scheduling considering the refresh request addresses RRQS_ADDR RQA1, RQA2 and RQA3. In this example, the memory device 200a performs operations according to the command scheduling of activate (ACT), read (RD), activate (ACT) and read (RD). In this example, row ROW1 is refreshed by activating row 1 of bank BANKB in response to a received command generated by the memory controller in response to the refresh request address RQA1 and refresh request RRQS sent to the controller by the memory device. ROW3 of BANKA is refreshed by the performing the associated read operation which includes activating bank BANKA and row ROW3 of BANKA in response to a read command RD. ROW2 of BANKB and ROW4 of BANKB are refreshed by respectively activating ROW2 of BANKB and ROW4 of BANKB in response to corresponding activate commands ACT received by the memory device 200a from the memory controller 100 (that may be generated in response to the refresh request address RQA2 and RQA3 and associated refresh requests RRQS sent from the memory device 200a to the memory controller 100).

Figure 12A:
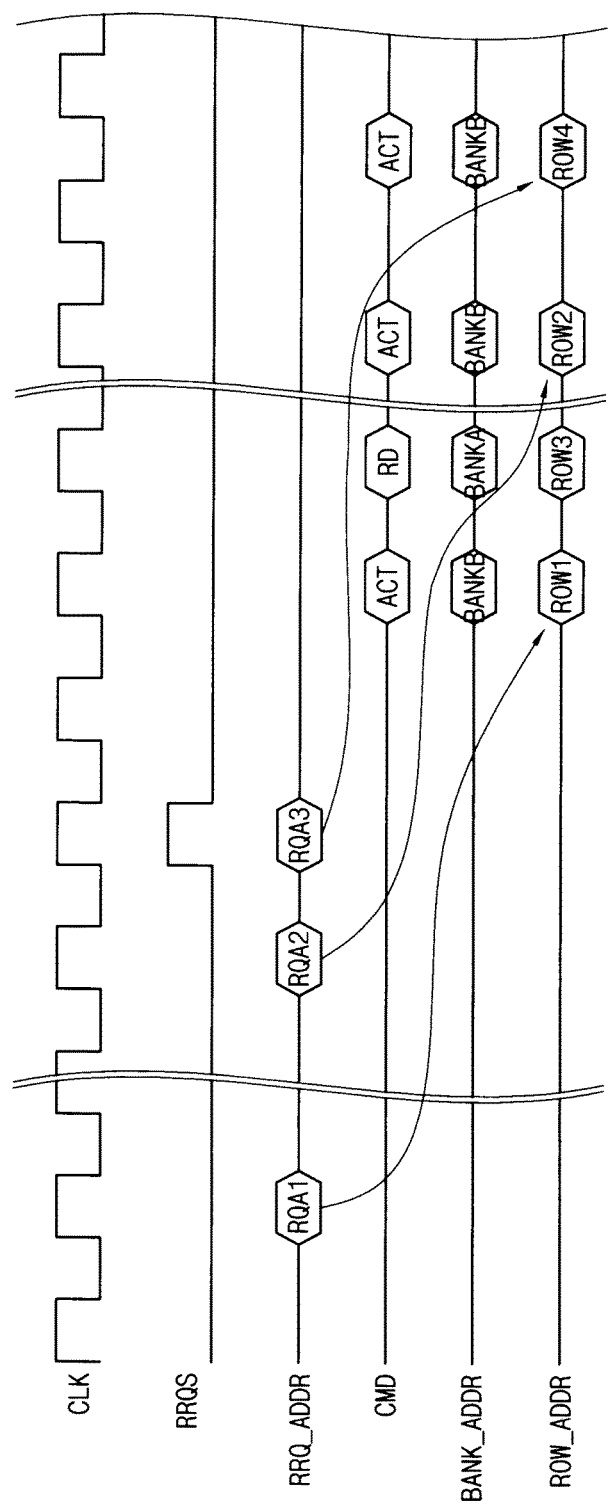
FIGS. 12A and 12B are timing diagrams illustrating operations of the memory system according to some example embodiments.

FIG. 12A is a timing diagram illustrating operation of the memory system according to some example embodiments.

In FIG. 12A, the refresh request signal RRQS is activated whenever a predetermined number of the refresh request addresses RRQ_ADDR are output. In accordance with this embodiment, the memory controller 100 may wait to schedule any refresh operations associated with the refresh request addresses RQA1, RQA2 and RQA3 until after receiving the refresh request RRQS. After the receipt of the current refresh request RRQS, memory controller 100 may act to issue commands to refresh the memory device (here ACT) for all request addresses received from the memory device since the receipt of the previous refresh request RRQS (here, refresh commands for RQA1, RQA2 and RQA3). Response of the memory device 200a to the received commands CMD may be the same as that described with respect to FIG. 11.

Figure 12B:
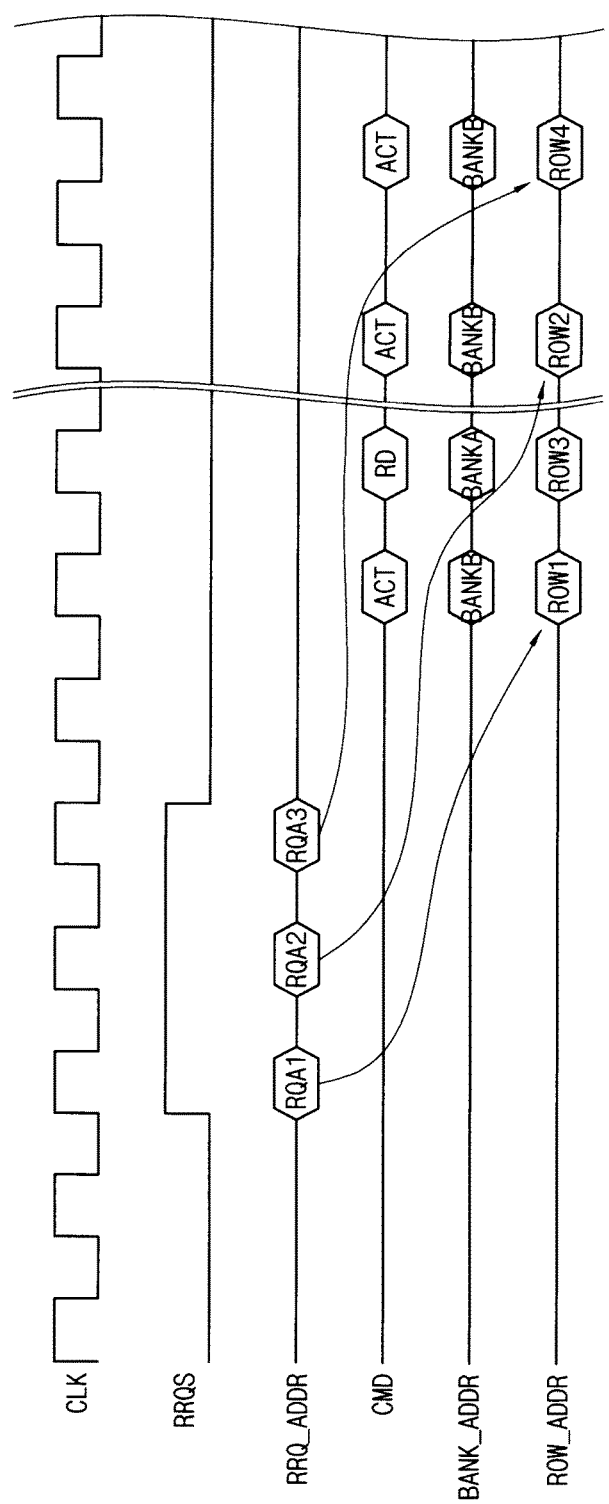

FIG. 12B is a timing diagram illustrating operation of the memory system according to some example embodiments. In FIG. 12B, the refresh information signal RI comprises the refresh request signal RRQS activated (here, logic high) over several cycles of clock CLK and concurrently transmitted refresh request addresses RQA1, RQA2 and RQA3, transmitted from the memory device 200a to the memory controller 100. In response to the refresh information signal RI, memory controller 100 may act to issue commands to refresh the memory device (here ACT) for all request addresses received while the refresh request signal RRQS was activated. Response of the memory device 200a to the received commands CMD may be the same as that described with respect to FIG. 11.

Figure 13:
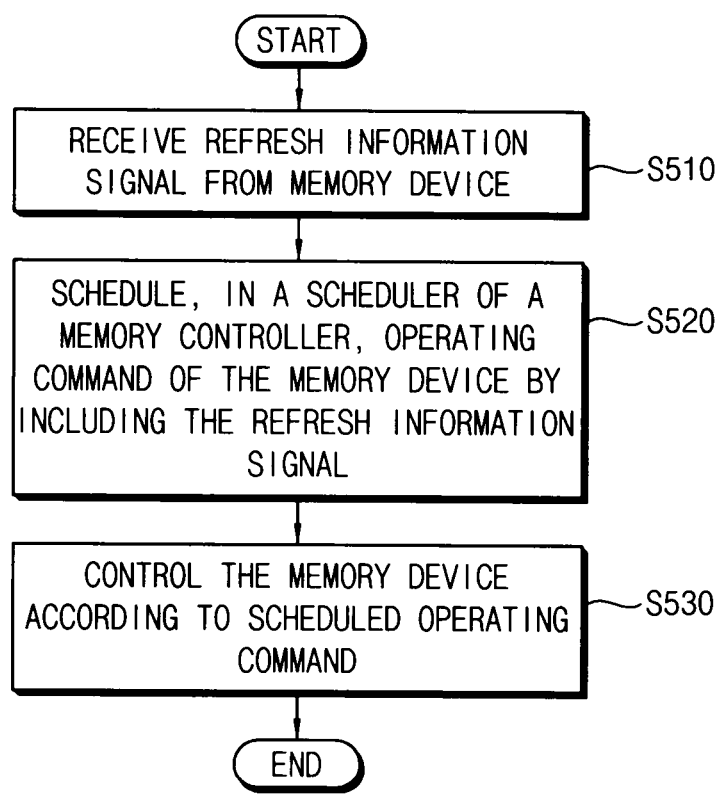
FIG. 13 is a flow chart illustrating a method of operating a memory system according to some example embodiments.

FIG. 13 is a flow chart illustrating a method of operating a memory system according to some example embodiments.

Hereinafter, there will be description on a method of operating a memory system with reference to FIGS. 2 to 13.

The memory controller 100 receives the refresh information signal RI including the refresh request signal from the memory device 200a (S510). The refresh request signal RRQS may be transmitted to the memory controller 100 through the separate transmission line TL4 and the refresh request address RRQ_ADDR may be transmitted to the memory controller 100 through the data transmission line(s) TL3. In addition, the refresh information signal RI may be request address RRQ_ADDR may be transmitted to the memory controller 100 in a packet type.

The scheduler 140 of the memory controller 100 schedules operation commands of the memory device 200a by considering the refresh information signal RI (S520). The memory controller 100 controls the memory device 200a according to the scheduled operation command (S530).

Figure 14:
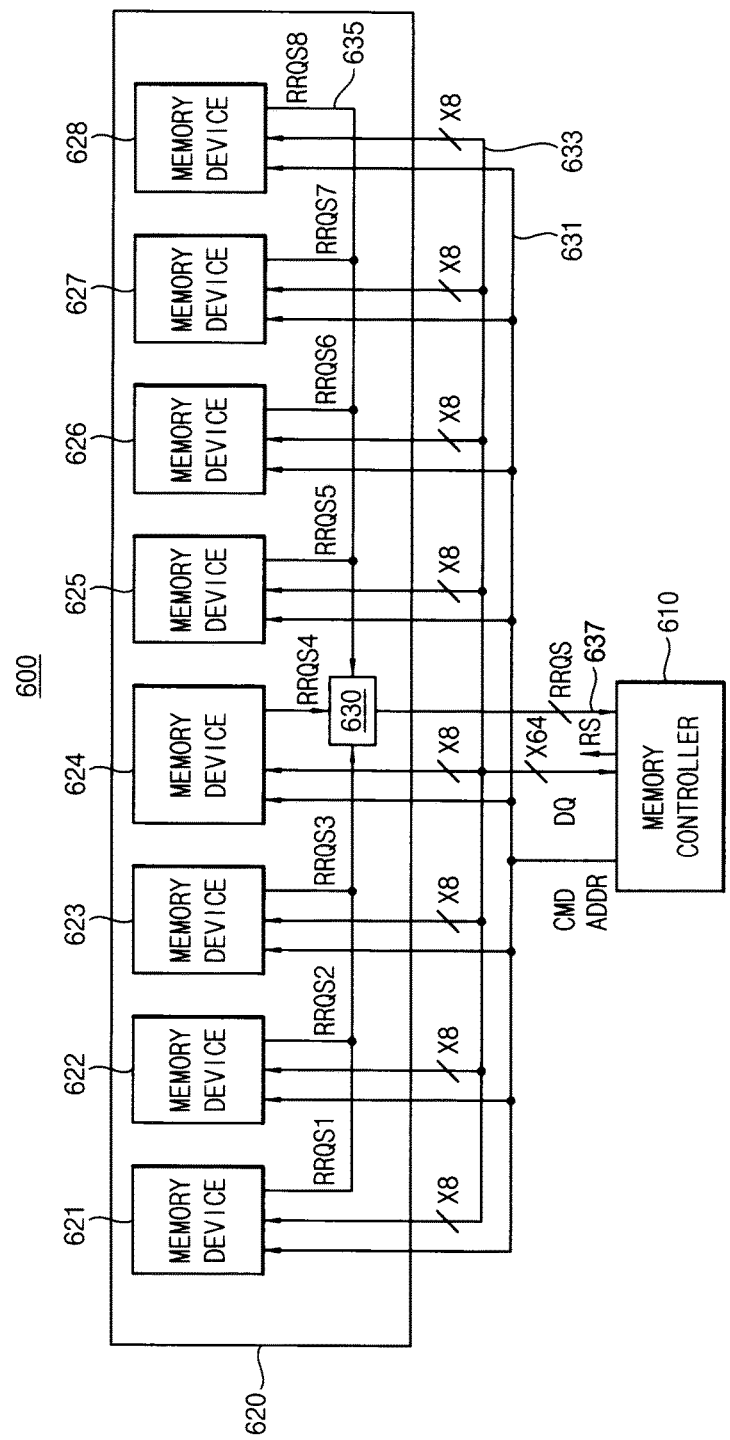
FIG. 14 is a block diagram illustrating a memory system according to some example embodiments.

FIG. 14 is a block diagram illustrating a memory system according to some example embodiments.

Referring to FIG. 14, a memory system 600 includes a memory controller 610 and a memory module 620. The memory module 620 includes a plurality of memory devices 621~628 and a signal merging circuit 630.

Each of the memory devices 621~628 exchanges 8-bit data X8 with the memory controller 610 through a data transmission line 633. The memory controller 610 transmits command CMD and address ADDR to the each of the memory devices 621~628 through a command/address transmission line 631.

Each of the memory devices 621~628 transmits to the signal merging circuit 630 a single-bit refresh request signal (one of RRQS1~RRQS8) when a refresh operation is required of the corresponding memory device, the signal merging circuit 630 transmits to the memory controller 610 a single-bit refresh request signal RRQS that is a logic high level when at least one of the refresh request signals RRQS1~RRQS8 is a logic high level through a separate transmission line 637. Each of the single-bit refresh request signals RRQS and RRQS1~RRQS8 may be in the form a pulse. When the memory controller 610 receives the refresh request signal RRQS having a logic high level, the memory controller 610 provides a response signal RS to the memory devices 621~628. The memory controller 610 may transmit the response signal RS to the refresh requesting one of the memory devices 621~628 (i.e., the memory device that issued the refresh request signal RRQS having a logic high level) through one or more of the data transmission lines 633 associated with the refresh requesting memory device.

When the refresh requesting memory device receives the response signal RS, the refresh requesting memory device transmits to the memory controller 610 the refresh address to be refreshed through the corresponding data transmission lines 633. The refresh address may be transmitted to the memory controller 610 in a packet type. When the memory controller 610 receives the refresh address, the memory controller 610 transmit a refresh command to the refresh requesting memory device and the refresh requesting memory device performs refresh operation in response to the refresh command. In addition, when the memory controller 610 receives the refresh address, the memory controller 610 schedules the operation command of the refresh requesting memory device by considering the refresh address to control the refresh requesting memory device according to the scheduled operation command. In some embodiments, the refresh address is transmitted to the memory controller 610 as part of refresh information RI.

Figure 15:
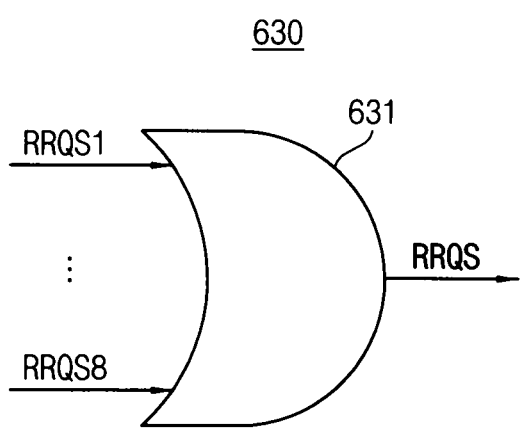
FIG. 15 illustrates an example of the signal merging circuit in FIG. 14.

FIG. 15 illustrates an example of the signal merging circuit in FIG. 14.

Referring to FIG. 15, the signal merging circuit 630 includes an OR gate 631. The OR gate 631 performs OR operation on the refresh request signals RRQS1~RRQS8 to output the refresh request signal RRQS that is high level when at least one of the refresh request signals RRQS1~RRQS8 is high level.

Figure 16:
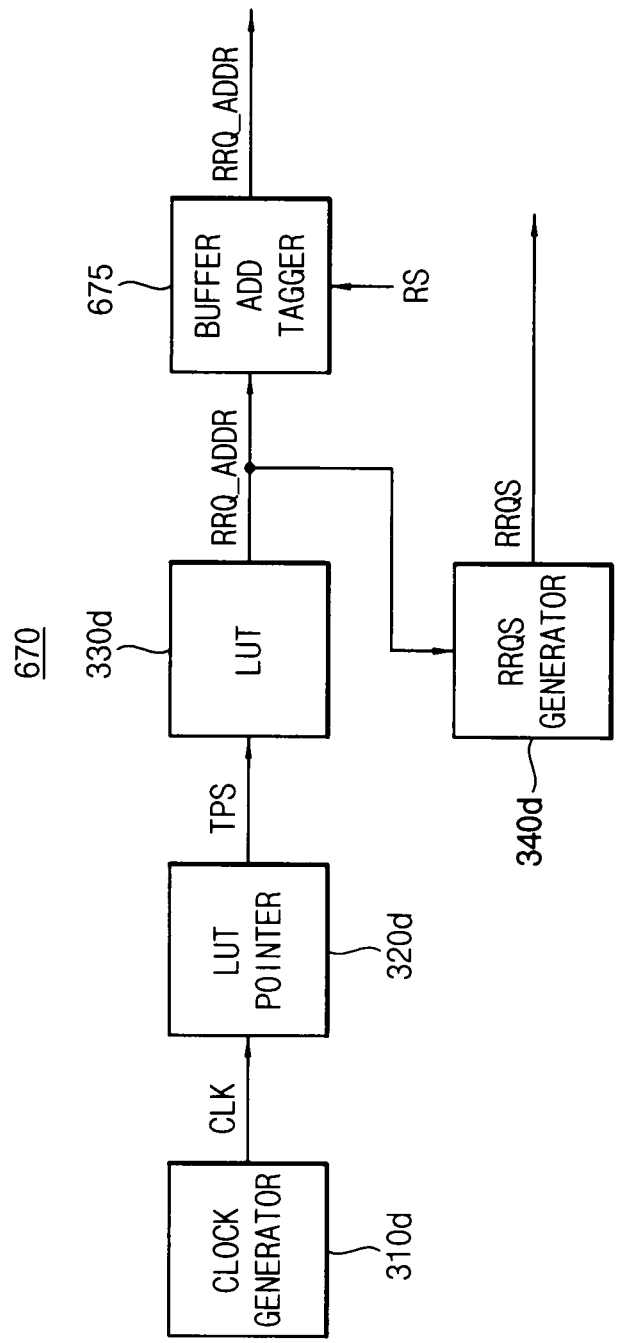
FIG. 16 is a block diagram illustrating a refresh request circuit that may be employed in each of the memory devices in FIG. 14.

FIG. 16 is a block diagram illustrating a refresh request circuit that may be employed in each of the memory devices in FIG. 14.

Referring to FIG. 16, a refresh request circuit 670 that may be employed in each of the memory devices 621~628 in FIG. 14 may include a clock generator 310d, a LUT pointer 320d, a LUT 330d, a refresh request signal generator 340d and an information tagger 675.

The clock generator 310d generates a clock signal CLK. The LUT pointer 320d generates a table pointing signal TPS indicating the refresh request addresses by gradually increasing table addresses of the LUT 330d in synchronization with the clock signal CLK. The LUT pointer 320d provides the table pointing signal TPS to the LUT 330d.

The LUT 330d stores refresh request addresses according to an order of memory cell rows to be refreshed based on the data retention time of the memory cells. The LUT 330d outputs as the refresh request address RRQ_ADDR a bank address and a row address designated by a table address indicated by the table pointing signal TPS. The clock generator 310d, the LUT pointer 320d, the LUT 330d and the RRQS generator 340d may be the same as and/or operate as those described above with respect to FIGS. 5, 8 and 9. In addition, the clock generator 310d, the LUT pointer 320d, the LUT 330d and the RRQS generator 340d may be replaced entirely with the circuitry of FIGS. 5, 8 and 9 (with our without an associated serializer, which, if implemented with the embodiment of FIG. 16, may serialize the tagged refresh request address RRQ_ADDR').

The buffer and information tagger 675 receives and stores refresh requests addresses RRQ_ADDR and adds memory identification information to the same creating corresponding tagged refresh request address RRQ_ADDR'. The buffer and information tagger 675 may either store the refresh request address RRQ_ADDR and tag the same upon output to the memory controller or store the tagged refresh request address RRQ_ADDR'. When the memory controller 610 receives the refresh request signal RRQS, the memory controller 610 transmits the response signal RS to the refresh requesting memory device (e.g., provided on one of the data lines DQ). In response to a response signal RS from the memory controller, the buffer and information tagger 675 transmits the tagged request address(es) RRQ_ADDR' to the memory controller. Alternatively, all the stored The memory devices 621~628 in FIG. 14 may have memory identification information such as '000', '001', '011', '100', '101', '110' and '111' respectively (which may be added to the refresh request addresses RRQ_ADDR as to create the tagged refresh request addresses RRQ_ADDR'). The tagged refresh request addresses RRQ_ADDR' may be discarded (e.g., marked as sent and ready for overwriting or deleted) from the buffer and tagger 675 after successful transmission to the memory controller.

In other embodiments, the buffer and information tagger 675 adds the memory identification information corresponding to the refresh request address RRQ_ADDR and priority information indicating refresh priority to the refresh request address RRQ_ADDR to output the tagged refresh request addresses RRQ_ADDR'. The memory controller may be responsive to the priority information to schedule refresh operations of the corresponding refresh request addresses RRQ_ADDR including providing out-of-order refresh commands that rearrange an order of refresh operations as compared to the order of refresh request addresses RRQ_ADDR provided by one or more of the LUT 330d of the memory devices 621628.

The refresh request signal generator 340d monitors the LUT 330d and may generate the refresh request signal RRQS in a manner described herein with respect to other embodiments.

Figure 17:
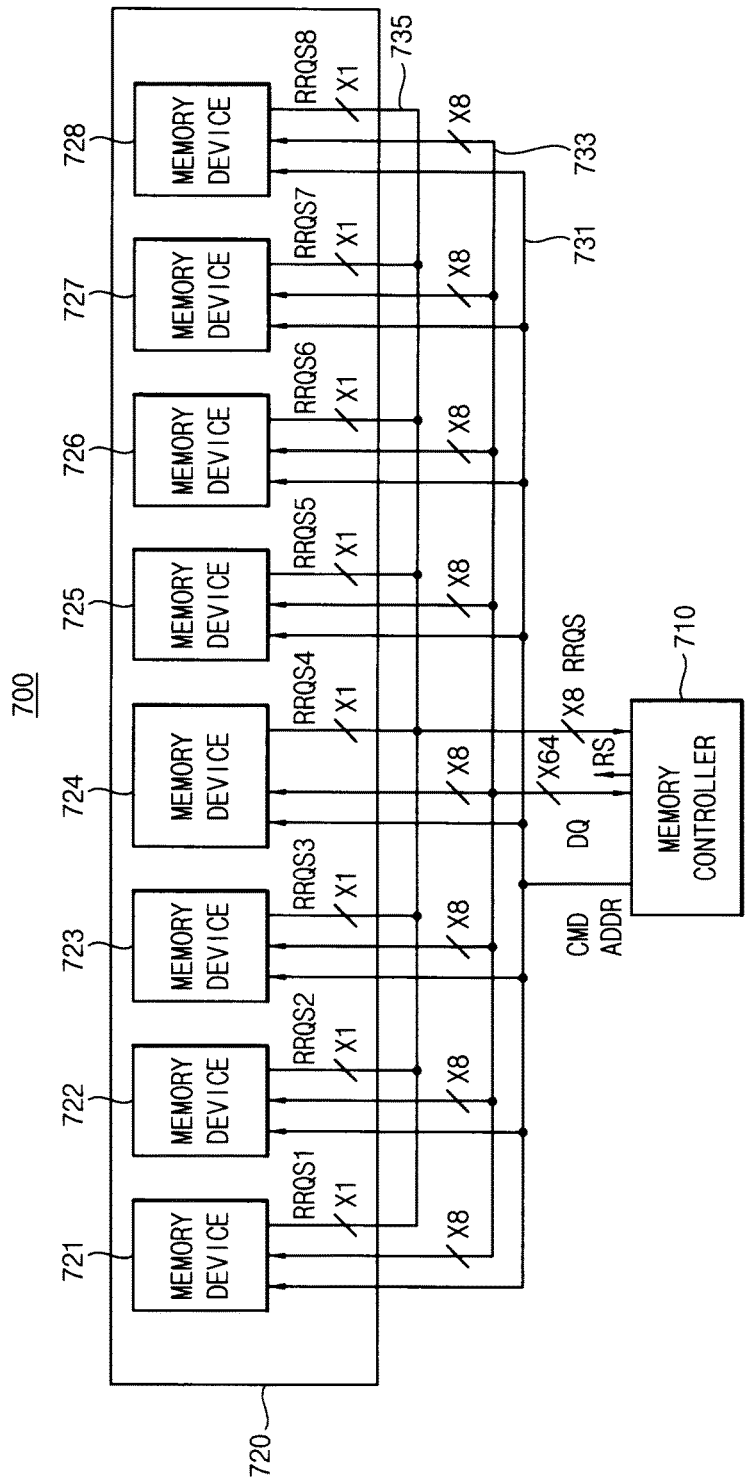
FIG. 17 is a block diagram illustrating a memory system according to other example embodiments.

FIG. 17 is a block diagram illustrating a memory system according to other example embodiments.

Referring to FIG. 17, a memory system 700 includes a memory controller 710 and a memory module 720. The memory module 720 includes a plurality of memory devices 721~728. Each of the memory devices 721~728 may include the refresh request circuit 670 of FIG. 16.

Each of the memory devices 721~728 exchanges 8-bit data X8 with the memory controller 710 through a data transmission line 733. The memory controller 710 transmits command CMD and address ADDR to the each of the memory devices 721~728 through a command/address transmission line 731.

Each of the memory devices 721~728 transmits to the memory controller 710 a single-bit X1 refresh request signal (one of RRQS1~RRQS8) which is activated when a refresh operation is required. The refresh request signal (one of RRQS1~RRQS8) is transmitted through a separate transmission line 635 dedicated to the corresponding memory device, and the memory controller 710 receives a 64 bit X64 data signal DQ and an 8 bit X8 refresh request signal RRQSx8, each bit of the refresh request signal corresponding to each of RRQS1~RRQS8. Since the each bit of the refresh request signal RRQSx8 corresponds to each of the refresh request signals RRQS1~RRQS8, the memory controller 710 identifies a refresh requesting memory based on the refresh request signal RRQSx8. For example, when the refresh request signal RRQSx8 is '00100000', the memory device 723 is the refresh requesting memory. For example, when the refresh request signal RRQSx8 is '00101000', the memory devices 723 and 725 are the refresh requesting memories. The memory controller 710 transmits the response signal RS to the refresh requesting memory device through the data transmission line 733.

When the refresh requesting memory device receives the response signal RS, the refresh requesting memory device transmit to the memory controller 710 the refresh information signal including refresh address to be refreshed and memory information through the data transmission line 733. The refresh information signal may be transmitted to the memory controller 710 in a packet type. When the memory controller 710 receives the refresh information signal, the memory controller 710 transmits a refresh command to the refresh requesting memory device and the refresh requesting memory device performs refresh operation in response to the refresh command. In addition, when the memory controller 710 receives the refresh information signal, the memory controller 710 schedules the operation command of the refresh requesting memory device by considering the refresh information signal to control the refresh requesting memory device according to the scheduled operation command.

Figure 18:
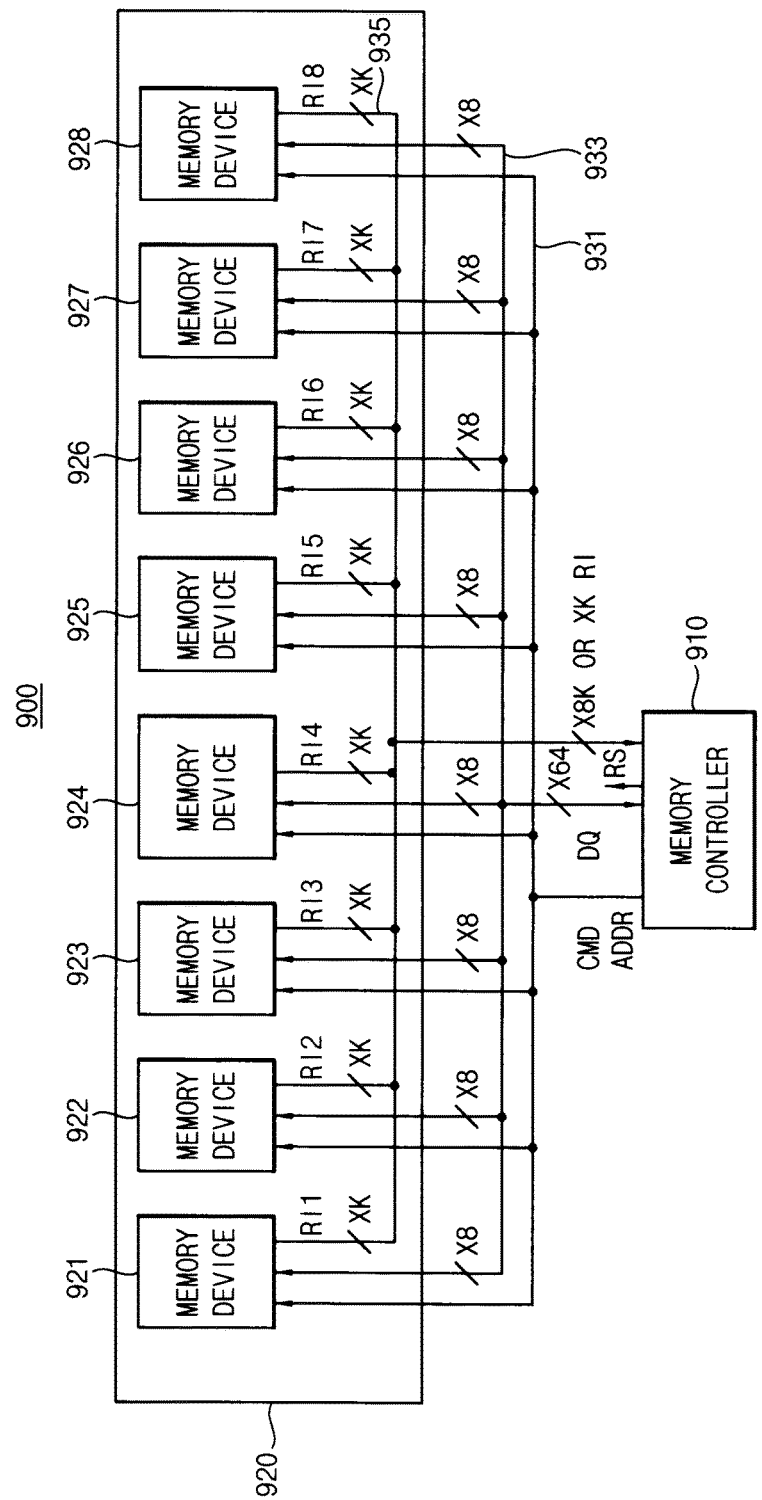
FIG. 18 is a block diagram illustrating a memory system according to other example embodiments.

FIG. 18 is a block diagram illustrating a memory system according to other example embodiments.

Referring to FIG. 18, a memory system 900 includes a memory controller 910 and a memory module 920. The memory module 920 includes a plurality of memory devices 921~928.

Each of the memory devices 921~928 exchanges 8-bit data X8 with the memory controller 910 through a data transmission line 933, combining to form a 64 bit X64 data signal DQ at the memory controller 910. The memory controller 910 transmits command CMD and address ADDR to the each of the memory devices 921~928 through a command/address transmission line 931.

Each of the memory devices 921~928 transmits to the memory controller 710 K-bits XK of refresh information signals RI (i.e., each of the refresh information signals RI1~RI8 have K bits). Each of the refresh information signals RI1~RI8 may include a refresh request signal RRQS, which may be a single-bit refresh request signal that is activated when a refresh operation is desired. Each of the refresh information signals RI1~RI8 may also include memory identification information transmitted through K transmission lines 935 shared between the memory devices 921~928 (for a total of K transmission lines, e.g. resulting in an aggregate bus width of K bits XK). Alternatively, each of the refresh information signals RI1~RI8 may be transmitted through k transmission lines 935 dedicated to the corresponding memory device 921~928 (for a total of 8×K transmission lines 935, e.g. resulting in a aggregate bus width of 8K bits or X8K). The memory controller 910 receives k-bit or 8 k-bit refresh information signal RI. The 8 k-bit refresh information signal RI includes refresh information signals RI1~RI8. The memory controller 910 decodes the refresh information signal RI and identifies a refresh requesting memory. The memory controller 910 transmits the response signal RS to the refresh requesting memory device through the data transmission line 933 in response to the refresh information signal RI.

When the refresh requesting memory device receives the response signal RS, the refresh requesting memory device transmits to the memory controller 910 the corresponding refresh address(es) to be refreshed (e.g., RQ_ADDR). If the transmission lines 935 are shared between memory devices, the refresh requesting memory device may also transmit memory information through the data transmission line 933 (e.g., RQ_ADDR'). The refresh address may be transmitted to the memory controller 910 in a packet type. When the memory controller 910 receives the refresh addresses (RQ_ADDR or with RQ_ADDR'), the memory controller 910 transmits a refresh command to the refresh requesting memory device and the refresh requesting memory device performs refresh operation in response to the refresh command. In addition, when the memory controller 910 receives the refresh information signal, the memory controller 910 schedules the operation command of the refresh requesting memory device by considering the refresh information signal to control the refresh requesting memory device according to the scheduled operation command.

In other embodiments, a mode register set may be used to replace refresh request circuit 300 or in conjunction with the refresh request circuit 300. In some embodiments, the mode register set may store a refresh rate of the entire memory device (e.g., chip or package) or may store plural refresh rates for corresponding portions of the memory device. For example, an eight bank memory device may store eight refresh rates, each for a corresponding one of the eight banks. As another example, the mode register set may store both plural refresh rates and associated plural address ranges (e.g., ranges of row addresses, such as a start row address and an end row address for each row address range). Each of the portions of memory (e.g., banks, rows or memory cell address groups) may be scheduled to be refreshed in response to the associated refresh rate stored in the mode register. The mode register may be programmed by an instruction (command) from the controller, and/or may be set during manufacturing in response to testing. The refresh request circuit 300 may use the refresh rate(s) stored by the mode register set to provide refresh request information RI (e.g., refresh requests RRQ and refresh request addresses RRQ_ADDR) to the memory controller 100 at timing responsive to the information of the mode register set (either for the entire device, or for each portion of the memory as appropriate). The information of the mode register set may replace the LUT 330 or may be used to generate or modify information stored by the LUT 330. Alternatively, the information of the mode register set may be transmitted to the memory controller 100 and used to generate refresh commands to the memory device with timing responsive to the information of the mode register set, such as when the refresh request circuit 300 is part of the memory controller 100. In this alternative, the refresh request circuit 300 in the memory device may be optional.

In other embodiments, a temperature sensor in the memory device measuring and/or estimating a temperature of the memory device may be used to control a timing of refresh operations of the memory device. Use of the temperature sensor may be in addition to or alternative to the refresh request circuit 300 and/or the mode register set storing one or more refresh rates described herein. For example, a memory controller 100 may access a temperature value of the temperature sensor to determine a refresh rate for the memory device. In addition to the received temperature value, the memory controller 100 may also take into consideration information transmitted from the memory device regarding refresh rates of individual rows or groups of rows in scheduling refresh commands and relative timing thereof (e.g., in embodiments when the refresh request circuit 300 is part of the memory controller 300 and/or when the memory controller accesses the mode register of a memory device, the temperature value may act to generate a weighting value to increase or decrease the respective rates of refresh operations to be scheduled). As another example, the temperature sensor may provide a temperature value to clock generator 310 and/or LUT pointer 320 and/or address counter 370 to control a frequency of their outputs (e.g., to increase/decrease the clock speed of the clock generator 310, to increase/decrease a number of cycles of clock CLK required by the LUT pointer 320 to change (e.g., increment) the table pointing signal TPS or, to increase/decrease a number of cycles of clock CLK required the address counter 370 to change (e.g., increment) the address output by the address counter 370. In this latter example, the temperature value of the temperature sensor may act to increase or decrease the respective rates of the refresh requests RRQ discussed herein with respect to other embodiments.

Figure 19:
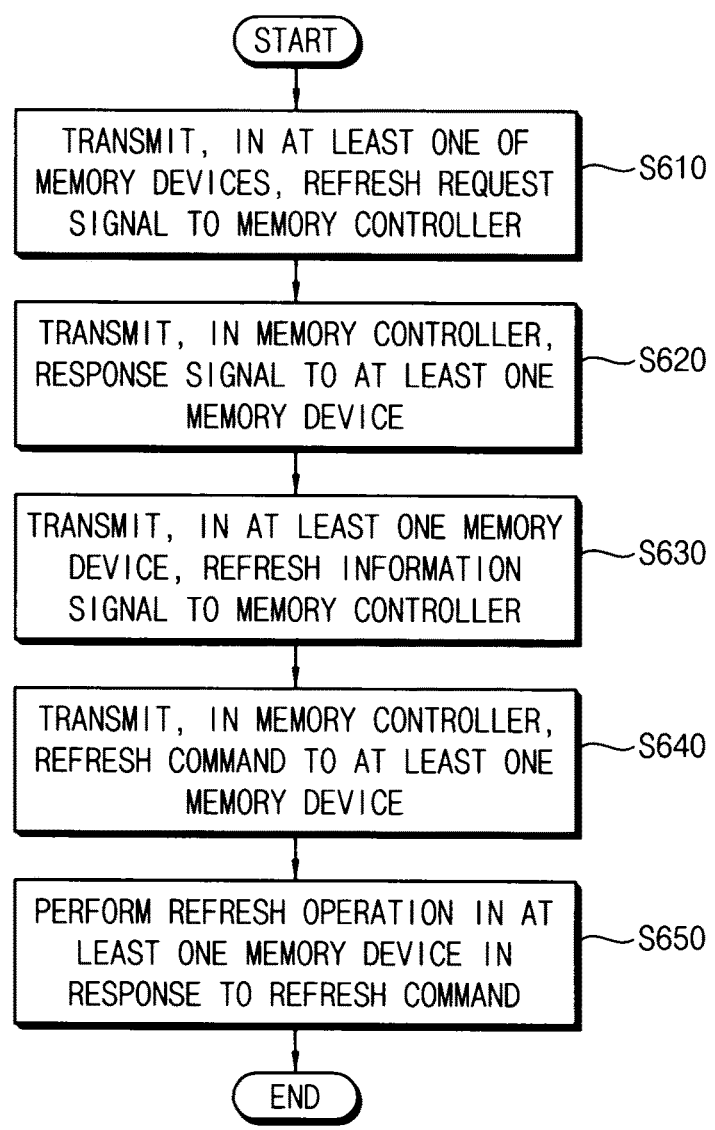
FIG. 19 is a flow chart illustrating a method of operating a memory system according to some example embodiments.

FIG. 19 is a flow chart illustrating a method of operating a memory system according to some example embodiments.

Hereinafter, there will be description on a method of operating a memory system with reference to FIGS. 14 to 19.

At least one of the plurality of memory devices 621~628 included in the memory module 620 transmits the refresh request signal RRQS having a logic high level to the memory controller 610 (S610). The refresh request signal RRQS may be transmitted to the memory controller 610 through the separate transmission lines (e.g., transmission lines 735) or a shared transmission line (e.g., 637). The memory controller 610 transmits the response signal RS to at least one refresh requesting memory device (S620). The memory controller 610 may transmit the response signal RS to the at least one refresh requesting memory device through the data transmission line 633. The at least one refresh requesting memory device transmits to the memory controller 610 the refresh information signal including the refresh request address and which may also include the memory identification information in response to the response signal RS (S630). The memory controller 610 receives the refresh information signal, schedules operation command by considering the refresh request address and transmits refresh command to the at least one refresh requesting memory device (S640). The at least one refresh requesting memory device performs refresh operation in response to the refresh command (S650).

As described above, the memory device requests refresh operation according to data retention time of memory cells or pages and the memory controller schedules operation command of the memory device by considering the requested refresh operation. Therefore, performance of the memory system may be enhanced and power consumption may be reduced.

Figure 20:
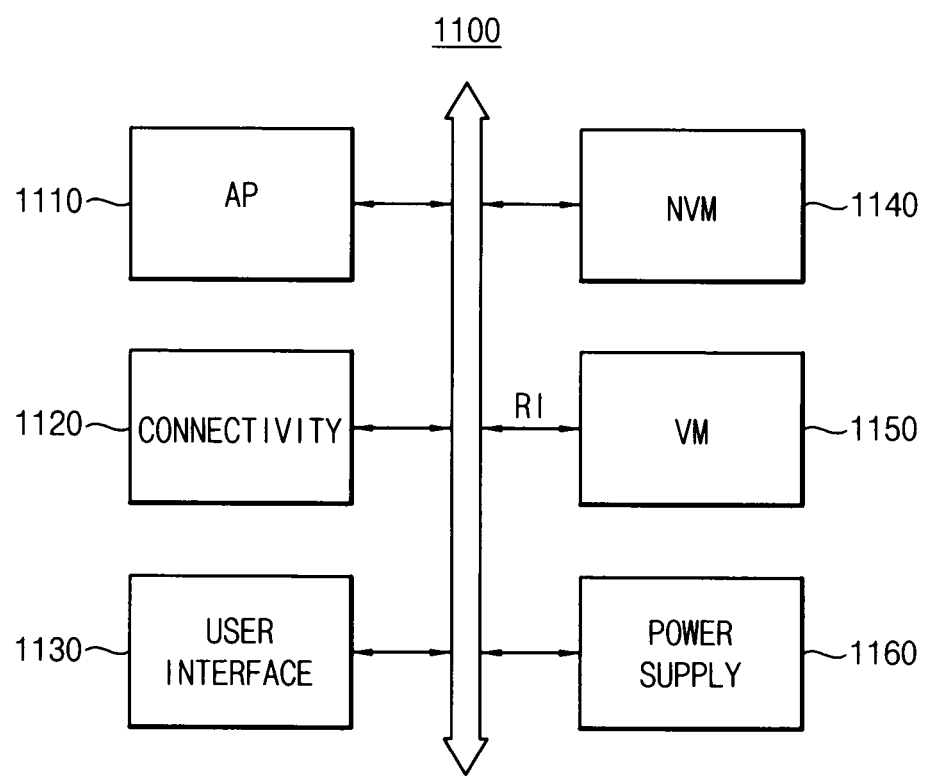
FIG. 20 is a block diagram illustrating a mobile system according to some exemplary embodiments.

FIG. 20 is a block diagram illustrating a mobile system according to some exemplary embodiments.

Referring to FIG. 20, a mobile system 1100 includes an application processor 1110, a connectivity unit 1120, a memory device 1150, a nonvolatile memory device 1140, a user interface 1130 and a power supply 1160. In some embodiments, the mobile system 1100 may be a mobile phone, a smart phone, a personal digital assistant (PDA), a portable multimedia player (PMP), a digital camera, a music player, a portable game console, a navigation system, etc.

The application processor 1110 may execute applications, such as a web browser, a game application, a video player, etc. In some embodiments, the application processor 1110 may include a single core or multiple cores. For example, the application processor 1110 may be a multi-core processor, such as a dual-core processor, a quad-core processor, a hexa-core processor, etc. The application processor 1110 may include an internal or external cache memory.

The connectivity unit 1120 may perform wired or wireless communication with an external device. For example, the connectivity unit 1120 may perform Ethernet communication, near field communication (NFC), radio frequency identification (RFID) communication, mobile telecommunication, memory card communication, universal serial bus (USB) communication, etc. In some embodiments, connectivity unit 1120 may include a baseband chipset that supports communications, such as global system for mobile communications (GSM), general packet radio service (GPRS), wideband code division multiple access (WCDMA), high speed downlink/uplink packet access (HSxPA), etc.

The memory device 1150 may store data processed by the application processor 1110, or may operate as a working memory. For example, the memory device 1150 may be a dynamic random access memory, such as DDR SDRAM, LPDDR SDRAM, GDDR SDRAM, RDRAM, etc., or may be any volatile memory device that requires a refresh operation. The memory device 1150 may provide the refresh information signal RI to the application processor 1110 when the memory device 1150 needs to be refreshed, as described herein with respect to any of the disclosed embodiments. The application processor 1110 perform command scheduling for the memory device 1150 considering the refresh information signal RI, as described herein with respect to any of the disclosed embodiments.

The nonvolatile memory device 1140 may store a boot image for booting the mobile system 1100. For example, the nonvolatile memory device 1140 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 1130 may include at least one input device, such as a keypad, a touch screen, etc., and at least one output device, such as a speaker, a display device, etc. The power supply 1160 may supply a power supply voltage to the mobile system 1100. In some embodiments, the mobile system 1100 may further include a camera image processor (CIS), and/or a storage device, such as a memory card, a solid state drive (SSD), a hard disk drive (HDD), a CD-ROM, etc.

In some embodiments, the mobile system 1100 and/or components of the mobile system 1100 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 21:
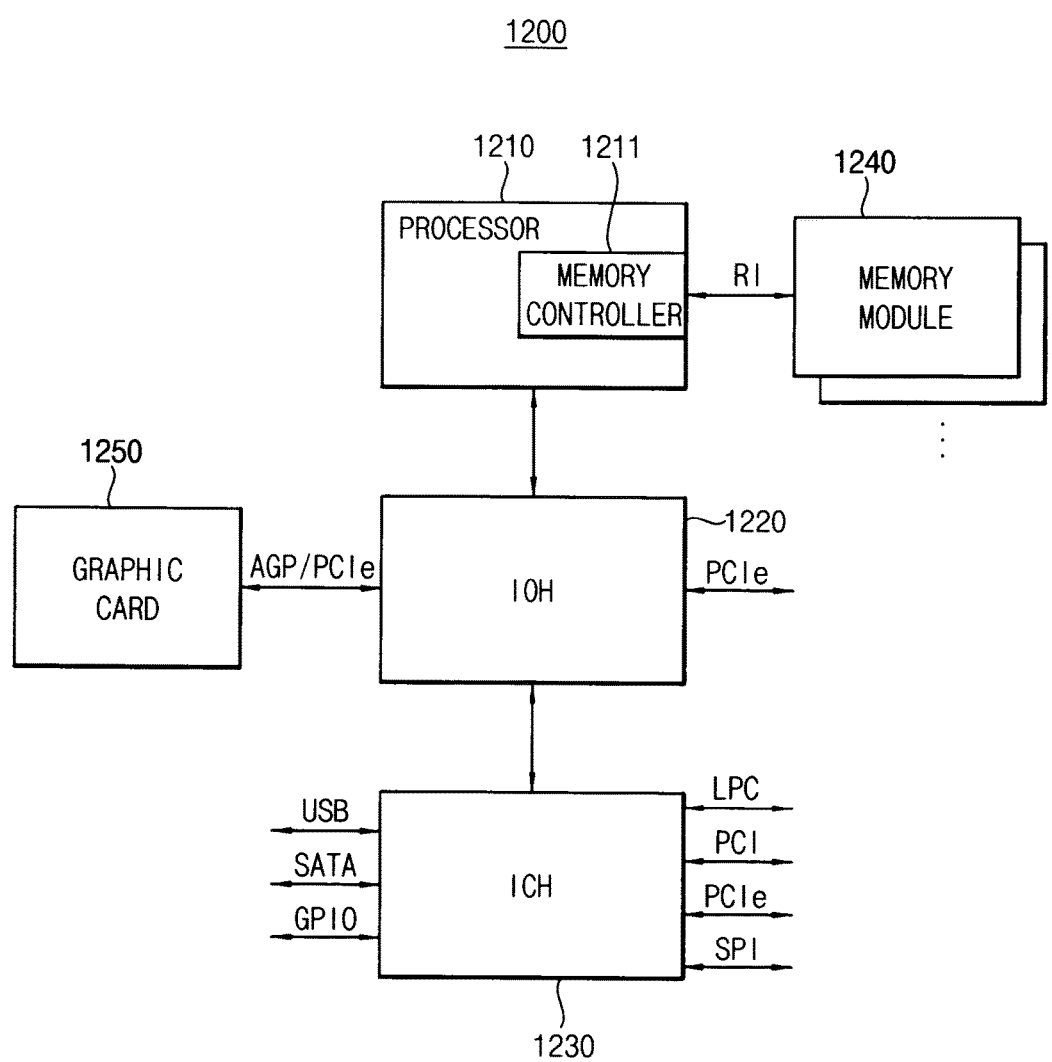
FIG. 21 is a block diagram illustrating a computing system according to some exemplary embodiments.

FIG. 21 is a block diagram illustrating a computing system according to some exemplary embodiments.

Referring to FIG. 21, a computing system 1200 includes a processor 1210, an input/output hub (IOH) 1220, an input/output controller hub (ICH) 1230, at least one memory module 1240 and a graphics card 1250. In some embodiments, the computing system 1200 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1210 may perform various computing functions, such as executing specific software for performing specific calculations or tasks. For example, the processor 1210 may be a microprocessor, a central process unit (CPU), a digital signal processor, or the like. In some embodiments, the processor 1210 may include a single core or multiple cores. For example, the processor 1210 may be a multi-core processor, such as a dual-core processor, a quad-core processor, a hexa-core processor, etc. Although FIG. 21 illustrates the computing system 1200 including one processor 1210, in some embodiments, the computing system 1200 may include a plurality of processors. The processor 1210 may include an internal or external cache memory.

The processor 1210 may include a memory controller 1211 for controlling operations of the memory module 1240. The memory controller 1211 included in the processor 1210 may be referred to as an integrated memory controller (IMC). A memory interface between the memory controller 1211 and the memory module 1240 may be implemented with a single channel including a plurality of signal lines, or may bay be implemented with multiple channels, to each of which at least one memory module 1240 may be coupled. In some embodiments, the memory controller 1211 may be located inside the input/output hub 1220, which may be referred to as memory controller hub (MCH).

The memory module 1240 may include a plurality of memory devices that store data provided from the memory controller 1211. The memory devices may provide the refresh information signal RI to the memory controller 1211 when the memory devices need to be refreshed, as described herein with respect to any of the disclosed embodiments. The memory controller 1211 may perform command scheduling for the memory devices considering the refresh information signal RI, as described herein with respect to any of the disclosed embodiments.

The input/output hub 1220 may manage data transfer between processor 1210 and devices, such as the graphics card 1250. The input/output hub 1220 may be coupled to the processor 1210 via various interfaces. For example, the interface between the processor 1210 and the input/output hub 1220 may be a front side bus (FSB), a system bus, a HyperTransport, a lightning data transport (LDT), a QuickPath interconnect (QPI), a common system interface (CSI), etc. Although FIG. 21 illustrates the computing system 1200 including one input/output hub 1220, in some embodiments, the computing system 1200 may include a plurality of input/output hubs. The input/output hub 1220 may provide various interfaces with the devices. For example, the input/output hub 1220 may provide an accelerated graphics port (AGP) interface, a peripheral component interface-express (PCIe), a communications streaming architecture (CSA) interface, etc.

The graphics card 1250 may be coupled to the input/output hub 1220 via AGP or PCIe. The graphics card 1250 may control a display device (not shown) for displaying an image. The graphics card 1250 may include an internal processor for processing image data and an internal memory device. In some embodiments, the input/output hub 1220 may include an internal graphics device along with or instead of the graphics card 1250 outside the graphics card 1250. The graphics device included in the input/output hub 1220 may be referred to as integrated graphics. Further, the input/output hub 1220 including the internal memory controller and the internal graphics device may be referred to as a graphics and memory controller hub (GMCH).

The input/output controller hub 1230 may perform data buffering and interface arbitration to efficiently operate various system interfaces. The input/output controller hub 1230 may be coupled to the input/output hub 1220 via an internal bus, such as a direct media interface (DMI), a hub interface, an enterprise Southbridge interface (ESI), PCIe, etc. The input/output controller hub 1230 may provide various interfaces with peripheral devices. For example, the input/output controller hub 1230 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1210, the input/output hub 1220 and the input/output controller hub 1230 may be implemented as separate chipsets or separate integrated circuits. In other embodiments, at least two of the processor 1210, the input/output hub 1220 and the input/output controller hub 1230 may be implemented as a single chipset.

The present inventive concept may be applied to any volatile memory device that requires a refresh operation and to a system including the volatile memory device. The present inventive concept may be applied to systems such as be a mobile phone, a smart phone, a personal digital assistant (PDA), a portable multimedia player (PMP), a digital camera, a music player, a portable game console, a navigation system, etc. The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A memory device, comprising:
a memory cell array including a plurality of rows of memory cells;
a refresh request circuit configured to issue requests for refresh operations to an external device; and
control logic configured to receive commands from the external device and control the memory device in accordance with the received commands,
wherein the refresh request circuit is configured to issue a request for a refresh operation for a first row of memory cells of the plurality of rows of memory cells to the external device, the request for the refresh operation issued to the external device in conjunction with an address of the first row of memory cells, and the control logic is configured to receive a first refresh command to refresh the first row from the external device and cause a refresh operation of the first row of memory cells in response to the first refresh command, and
wherein the refresh request circuit is configured to issue each request for a refresh operation as a refresh request signal via a first terminal of the memory device.

2. The memory device of claim 1, wherein the refresh request circuit is configured to issue requests for refresh operations for a plurality of first rows of memory cells of the memory device at a first refresh rate and issue requests for refresh operations for a plurality of second rows of memory cells of the memory device at one or more second refresh rates, each of the one or more second refresh rates being higher than the first refresh rate.

3. The memory device of claim 2,
wherein the refresh request circuit comprises a lookup table configured to store addresses of the plurality of second rows of memory cells at table entries of the lookup table, and
wherein a sequential access of the entries of the lookup table determines a timing of issuance of requests for refresh operations for the second rows of memory cells.

4. The memory device of claim 3,
wherein the lookup table is configured to store addresses of the plurality of first rows of memory cells at table entries of the lookup table, and
wherein sequential access of the entries of the lookup table determine a timing of issuance of requests for refresh operations for the first rows of memory cells.

5. The memory device of claim 3,
wherein the refresh request circuit comprises an address counter configured to generate sequential addresses of the memory cells of the memory cell array, including addresses of the first and second rows of memory cells, the refresh request circuit configured to issue requests for refresh operations for rows of memory cells identified by the sequential addresses generated by the address counter.

6. The memory device of claim 5, further comprising a multiplexer, the multiplexer configured to select sequential addresses generated by the address counter and addresses of the plurality of second rows of memory cells output by the lookup table and provide the selected address for output to the external device.

7. The memory device of claim 3, further comprising a lookup table pointer generator configured to output and regularly change a table pointing signal used to access a table entry of the lookup table corresponding to the table pointing signal.

8. The memory device of claim 7,
wherein the lookup table includes empty table entries between table entries containing addresses of second rows of memory cells acting to regulate a timing between a sequential output of the addresses of the second rows of memory cells.

9. The memory device of claim 7,
wherein entries of the lookup table include wait information, and
wherein a timing of a change of the table pointing signal is responsive to the wait information.

10. The memory device of claim 7,
wherein entries of the lookup table include wait information, and
wherein a timing of a change of the table pointing signal from identifying a first entry of the lookup table to identifying a second entry of the lookup table is responsive to wait information stored with the first entry of the lookup table.

11. A memory controller comprising:
a command generator configured to generate memory commands in response to externally received command requests from a host;
a scheduler configured to generate a command queue providing a sequential list of memory commands to be issued to a memory device external to the memory controller, the sequential list of memory commands comprising the memory commands generated by the command generator in response to the command requests from the host;
at least one terminal to receive a refresh request from the memory device; and
a storage unit configured to store one or more addresses of the memory device received with the refresh request from the memory device,
wherein the scheduler is configured to alter the sequential list of memory commands in the command queue to insert refresh commands into the command queue, the refresh commands including the one or more addresses of the memory device stored in the storage unit to identify locations of the memory device to be refreshed.

12. The memory controller of claim 11, wherein the storage unit is configured to store non-sequential addresses of the memory device to provide different refresh rates for different memory locations of the memory device.

13. The memory controller of claim 11, wherein the scheduler is configured to provide refresh commands for first rows of memory cells at a first rate and provide refresh commands for second rows of memory cells at one or more second rates, the second rates being higher than the first rate.

14. The memory controller of claim 11, further comprising a buffer configured to receive the one or more addresses of the memory device from the memory device.

15. The memory controller of claim 14, wherein the at least one terminal comprises a data mask pin configured to receive the refresh request from the memory controller.

16. A memory system comprising the memory device of claim 1 and an external device, wherein the external device is a memory controller connected to the memory device to provide commands to the memory device.

17. The memory controller of claim 11, wherein the scheduler is configured to generate the sequential list of memory commands in the command queue prior to receipt of the refresh request from the memory device and to alter the sequential list of memory commands in the command queue after receipt of the refresh request from the memory device.

18. The memory controller of claim 17, wherein the memory controller is implemented in a single semiconductor chip.

19. The memory device of claim 1, wherein the memory device is implemented in a single semiconductor chip.

20. The memory device of claim 1, wherein the first terminal is separate from all data terminals and all address terminals of the memory device.

21. The memory device of claim 1, wherein the refresh request circuit is configured to transmit the address of the first row of memory cells to the external device via terminals of the memory device used for transmitting data of the memory device.

22. The memory device of claim 1, wherein the refresh request circuit is configured to transmit the address of the first row of memory cells to the external device at the same time as transmitting the request for the refresh operation.

23. The memory device of claim 1, wherein the refresh request signal is a first logic level transmitted to the external device via the first terminal.

24. The memory device of claim 1, wherein the first terminal is a data mask terminal.

25. The memory device of claim 1, wherein the first terminal is dedicated to communicating refresh request information.

26. A memory device, comprising:
a memory cell array including a plurality of rows of memory cells including a first row of memory cells and a second row of memory cells;
a refresh request circuit configured to issue requests for refresh operations to an external device, the requests for refresh operations including a first request for a refresh operation of the first row of memory cells and a second request for a refresh operation of the second row of memory cells; and
control logic configured to receive commands from the external device and control the memory device in accordance with the received commands,
wherein the refresh request circuit is configured to issue the first request for the refresh operation of the first row of memory cells to the external device in conjunction with transmitting an address of the first row of memory cells to the external device, and the control logic is configured to receive a first refresh command to refresh the first row from the external device and cause a refresh operation of the first row of memory cells in response to the first refresh command,
wherein the refresh request circuit is configured to issue the second request for the refresh operation of the second row of memory cells to the external device in conjunction with transmitting an address of the second row of memory cells to the external device, and the control logic is configured to receive a second refresh command to refresh the second row from the external device and cause a refresh operation of the second row of memory cells in response to the second refresh command, and
wherein a duration between the first request for the first refresh operation and the second request for the second refresh operation is responsive to at least one of a look-up table of the memory device and a counter of the memory device.

* * * * *